(12) United States Patent
Ookura et al.

(10) Patent No.: US 7,868,270 B2
(45) Date of Patent: Jan. 11, 2011

(54) TEMPERATURE CONTROL FOR PERFORMING HEAT PROCESS IN COATING/DEVELOPING SYSTEM FOR RESIST FILM

(75) Inventors: Jun Ookura, Koshi (JP); Eiichi Sekimoto, Koshi (JP); Hisakazu Nakayama, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 116 days.

(21) Appl. No.: 12/022,522

(22) Filed: Jan. 30, 2008

(65) Prior Publication Data

US 2008/0283515 A1    Nov. 20, 2008

(30) Foreign Application Priority Data

Feb. 9, 2007    (JP) .............................. 2007-030202

(51) Int. Cl.
*H05B 3/68* (2006.01)
(52) U.S. Cl. ............................... 219/448.11; 219/444.1
(58) Field of Classification Search ... 219/443.1–468.2, 219/482–494, 162; 118/724–728; 432/253, 432/258
See application file for complete search history.

(56) References Cited

U.S. PATENT DOCUMENTS 7,536,230 B2 * 5/2009 Nanno et al. .................. 700/30

FOREIGN PATENT DOCUMENTS

| JP | 11-67619 | 3/1999 |
|---|---|---|
| JP | 2001-230199 | 8/2001 |
| JP | 2003-142386 | 5/2003 |
| JP | 2005-33178 | 2/2005 |
| JP | 2007-11982 | 1/2007 |
| JP | 2007-79897 | 3/2007 |

* cited by examiner

*Primary Examiner*—Sang Y Paik
(74) *Attorney, Agent, or Firm*—Oblon, Spivak, McClelland, Maier & Neustadt, L.L.P.

(57) ABSTRACT

A temperature control method is used for controlling a temperature of a hot plate, so that a measured temperature of the hot plate conforms to a target temperature thereof, in a heat processing apparatus for performing a heat process on a substrate placed on the hot plate, which is used in a coating/developing system for applying a resist coating onto the substrate to form a resist film and then performing development on the resist film after light exposure. The method includes acquiring adjustment data necessary for adjusting a reaching time defined by a time period for increasing the temperature of the substrate from a first temperature around an initial temperature to a second temperature around the target temperature; and adjusting the target temperature by use of the adjustment data thus acquired, after starting the process on the substrate.

18 Claims, 14 Drawing Sheets

TEMPERATURE CONTROL FOR PERFORMING HEAT PROCESS IN COATING/DEVELOPING SYSTEM FOR RESIST FILM

BACKGROUND OF THE INVENTION

1. Field of the Invention

The present invention relates to a temperature control method for controlling the temperature of a hot plate in a heat processing apparatus for performing a heat process on a substrate placed on the hot plate, which is used in a coating/developing system for applying a resist coating onto a substrate, such as a semiconductor wafer, to form a resist film and then performing development on the resist film after light exposure. The present invention further relates to a temperature controller and heat processing apparatus, which are suitably compatible with the temperature control method.

2. Description of the Related Art

In the sequence of photolithography for semiconductor devices, a resist is applied onto a semiconductor wafer (which will be simply referred to as a wafer) to form a resist film. Then, the resist film is subjected to a light exposure process in accordance with a predetermined circuit pattern. Then, the light-exposed pattern thus formed is subjected to a developing process to form a circuit pattern on the resist film. During this sequence, various heat processes are performed, such as a heat process (pre-baking) after resist coating, a heat process (post-exposure-baking) after light exposure, and a heat process (post-baking) after development.

The resist coating, the development after light exposure, and the heat processes described above are preformed by a resist coating/developing system which includes a plurality of processing units for performing these processes and transfer units for sequentially transferring wafers to perform a series of processes.

In general, a heat processing unit for performing a heat process in this coating/developing system is structured to perform a heat process on a target substrate or wafer placed on a hot plate, which is provided with a heater and a temperature sensor built therein and is controlled to be at a target temperature by a temperature controller (for example, Jpn. Pat. Appln. KOKAI Publication No. 11-067619).

In a resist coating/developing system of this kind, heat processing units play a significant role, because the thermal history of a wafer determined by heat processes greatly affects the quality of devices. A thermal history determined by a heat process on a wafer is defined by an integrated amount of heat applied to the wafer by the heat process performed for a certain time period from loading of the wafer onto a hot plate to unloading of the wafer therefrom. Accordingly, in order to perform a heat process uniformly on a number of wafers so as to decrease the variations in device quality, the thermal histories of the wafers are preferably set constant.

In a heat process of this kind, when a semiconductor wafer is placed on a hot plate adjusted at a target temperature, the semiconductor wafer takes heat from the hot plate. The temperature of the hot plate is thus decreased temporarily, and then gradually returned to the target temperature. On the other hand, the temperature of the semiconductor wafer starts being gradually increased immediately after loading thereof onto the hot plate, then stabilized around the target temperature, and then decreased by unloading thereof from the hot plate.

Accordingly, in order to perform a heat process uniformly on a number of wafers so as to decrease the variations in device quality, the stable temperature times of the wafers, in which the temperature thereof is stable around a target temperature, are preferably set constant.

A heat process performed on wafers may be controlled by the time period from loading of a wafer onto a hot plate to unloading of the wafer from the hot plate. In this case, in order to make the stable temperature times constant, reaching times (temperature increase times) need to be set constant, wherein the reaching time is defined by a time period for increasing the temperature of a wafer from an initial temperature before staring the process to a temperature around a target temperature.

However, where a plurality of heat processing units are used for heat-processing a number of semiconductor wafers, individual differences, such as the heater capacity of a hot plate, are inevitably present between the heat processing units. Further, component parts and/or installation ambiences are not the same between the heat processing units. Consequently, the temperature increase times of the heat processing units differ from each other, and thus the stable temperature times of the heat processing units also differ from each other, thereby brings about variations in device quality among wafers.

BRIEF SUMMARY OF THE INVENTION

An object of the present invention is to provide a temperature control method that can suppress the differences in the stable temperature times of substrates, such as semiconductor wafers, in a heat process, thereby decrease the variations in device quality. Another object of the present invention is to provide a temperature controller and heat processing apparatus, which are suitably compatible with the temperature control method.

According to a first aspect of the present invention, there is provided a temperature control method for controlling a temperature of a hot plate, so that a measured temperature of the hot plate conforms to a target temperature thereof, in a heat processing apparatus for performing a heat process on a substrate placed on the hot plate, which is used in a coating/developing system for applying a resist coating onto the substrate to form a resist film and then performing development on the resist film after light exposure, the method comprising:

acquiring adjustment data necessary for adjusting a reaching time defined by a time period for increasing the temperature of the substrate from a first temperature around an initial temperature to a second temperature around the target temperature; and adjusting the target temperature by use of the adjustment data thus acquired, after starting the process on the substrate.

The temperature around the initial temperature includes the initial temperature before starting the process and a temperature near the initial temperature. The temperature around the initial temperature is preferably a temperature within a range limited by several degrees centigrade from the initial temperature. The temperature around the target temperature includes the target temperature and a temperature near the target temperature. The temperature around the target temperature is preferably a temperature within a range limited by, e.g., several degrees centigrade from the target temperature. If there is a fluctuation in the substrate temperature around the target temperature, the temperature can be deemed to reach the second temperature when the temperature converges into a predetermined temperature range about the second temperature.

The adjustment data is data for adjusting the target temperature, such as temperature data concerning an increase to be added to or a decrease to be subtracted from a before-adjustment target temperature used as a reference, and/or time-series temperature data.

The temperature control method according to the first aspect described above is arranged to adjust the target temperature, after starting the process, by use of the adjustment data necessary for adjusting a reaching time defined by a time period for increasing the temperature of the substrate from a temperature around the initial temperature to a temperature around the target temperature. Consequently, it is possible to adjust the reaching time to be optimum to the process on the substrate, and thereby to perform a desired heat process on the substrate.

In the first aspect, the method preferably comprises controlling the temperature of the hot plate by use of deviation between an after-adjustment target temperature and a measured temperature of the hot plate.

The method may comprise a first stage arranged to measure a before-adjustment reaching time, and a second stage arranged to acquire the adjustment data by use of a time difference between a measured reaching time and a target reaching time.

The method may comprise selecting timing of temperature increase start used as a reference for the before-adjustment reaching time, from the group consisting of:

(a) a maximum point of a temperature increase rate obtained by approximating an average value of a substrate temperature profile by a polynomial equation of quintic or a higher degree, (b) a start point of increase in a substrate temperature caused upon loading of the substrate onto the hot plate, (c) a time point when a temperature increase rate exceeds a predetermined value in an average value of a substrate temperature profile, and (d) a point calculated by an inverse operation from a temperature decrease start point at an end of the heat process used as a reference.

The method may comprise obtaining and determining the target reaching time in accordance with a temperature range of the process performed on the substrate, by use of an operation selected from the group consisting of:

(a) setting the target reaching time in accordance with process conditions, and (b) presetting standard values for respective temperature ranges in accordance with a "hot plate vs. substrate" characteristic.

The second stage may be arranged to acquire the adjustment data by use of a predetermined relation formula showing a relation between the time difference and the adjustment data. In this case, "by use of a relation formula" is not limited to a case where the adjustment data is directly calculated by the relation formula. For example, this includes a case where the adjustment data is obtained by use of a table showing the correlation between the time difference calculated by the relation formula and the adjustment data.

The method preferably comprises repeating the first stage and the second stage a plurality of times to acquire the adjustment data. In this case, the adjustment data can be obtained with high precision.

The method may comprise adjusting the target temperature in accordance with the adjustment data at a predetermined timing after starting the process on the substrate. The predetermined timing may be a time point when the hot plate reaches a predetermined temperature after starting the process, or a time point when a predetermined time has elapsed from starting the process. The substrate may be processed for a certain time on the hot plate.

The coating/developing system may include a plurality of heat processing units, and the method may comprise adjusting reaching times of respective hot plates of the heat processing units to be a common target reaching time. In this case, even if reaching times of the heat processing units differ from each other due to individual differences, it is possible to control variations in the process among the heat processing units.

According to a second aspect of the present invention, there is provided a temperature controller for controlling a temperature of a hot plate, so that a measured temperature of the hot plate conforms to a target temperature thereof, in a heat processing apparatus for performing a heat process on a substrate placed on the hot plate, which is used in a coating/developing system for applying a resist coating onto the substrate to form a resist film and then performing development on the resist film after light exposure, the temperature controller comprising:

a storage portion that stores adjustment data necessary for adjusting a reaching time defined by a time period for increasing the temperature of the substrate from a first temperature around an initial temperature to a second temperature around the target temperature; and an adjusting portion that adjusts the target temperature by use of the adjustment data, after starting the process on the substrate.

The adjustment data may be stored in the storage portion from a host controller by communication. Alternatively, the adjustment data may be stored in the storage portion in accordance with setting by a setting section. Alternatively, the adjustment data may be calculated by this temperature controller.

The temperature controller according to the second aspect described above is arranged to adjust a reaching time defined by a time period for increasing the temperature of the substrate from a temperature around an initial temperature to a temperature around the target temperature. Consequently, it is possible to perform a desired heat process on the substrate. Where the coating/developing system includes a plurality of heat processing units, which have reaching times different from each other, the temperature controller may be arranged to adjust reaching times of the respective hot plates of the heat processing units to be a common target reaching time. In this case, even if the reaching times of the heat processing units differ from each other due to individual differences, it is possible to control variations in the process among the heat processing units.

In the second aspect, the adjusting portion may be arranged to adjust the target temperature in accordance with the adjustment data at a predetermined timing after starting the process. The controller may further comprise a calculation part arranged to calculate the adjustment data by use of a time difference between a before-adjustment reaching time and a target reaching time.

According to a third aspect of the present invention, there is provided a heat processing apparatus for performing a heat process on a substrate, which is used in a coating/developing system for applying a resist coating onto the substrate to form a resist film and then performing development on the resist film after light exposure, the heat processing apparatus comprising:

a hot plate configured to heat a substrate placed thereon;

a temperature detecting device configured to detect a temperature of the hot plate, and the temperature controller according to the second aspect for controlling a temperature of the hot plate, so that a detected temperature by the temperature detecting device conforms to a target temperature thereof.

The heat processing apparatus according to the third aspect described above can adjust a reaching time defined by a time period for increasing the temperature of the substrate from a temperature around the initial temperature to a temperature around the target temperature. Consequently, it is possible to adjust the reaching time to be optimum to the process on the substrate, and thereby to perform a desired heat process on the substrate.

Additional objects and advantages of the invention will be set forth in the description which follows, and in part will be obvious from the description, or may be learned by practice of the invention. The objects and advantages of the invention may be realized and acquired by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will now be described with reference to the accompanying drawings.

Figure 1:
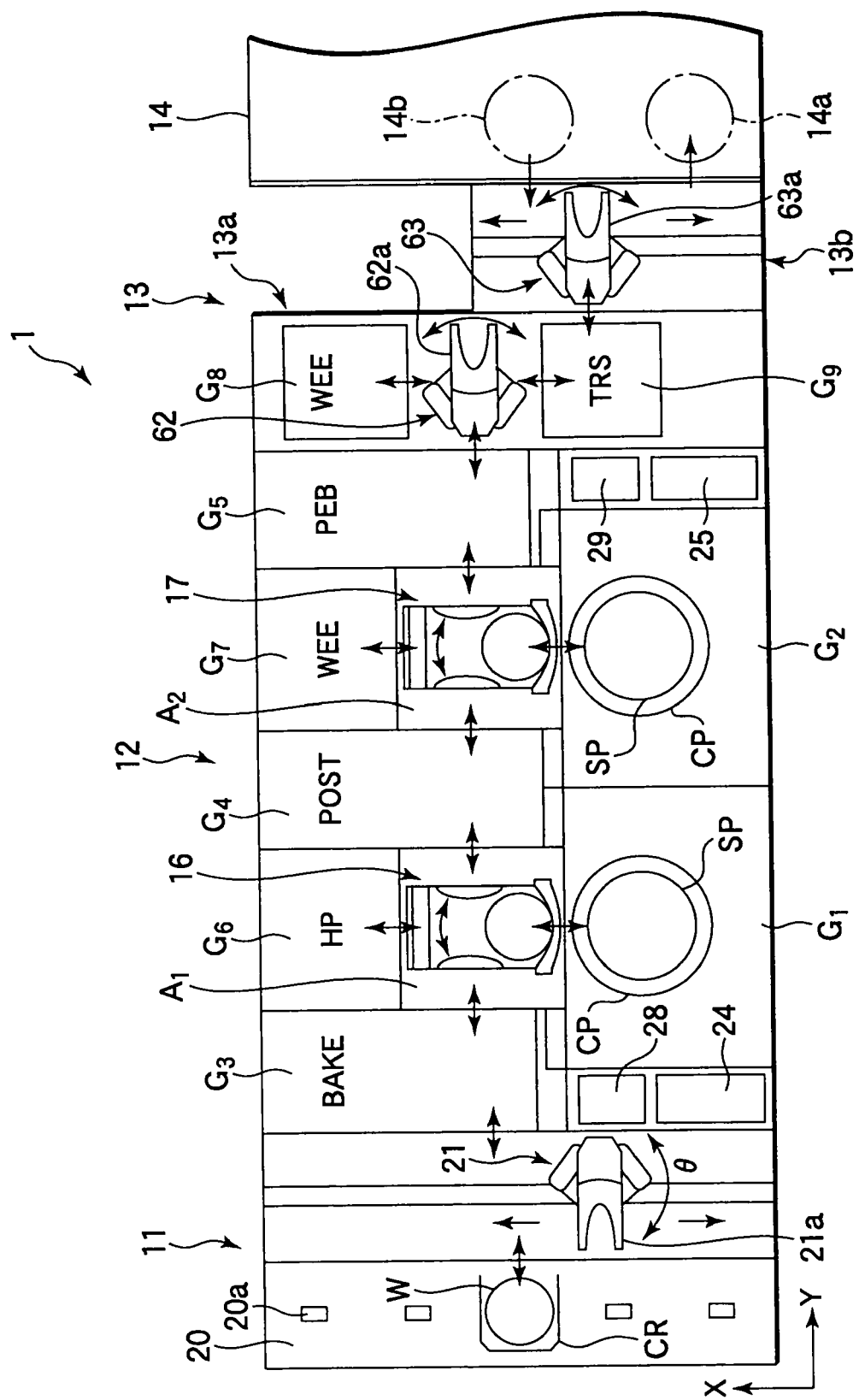
FIG. 1 is a plan view schematically showing a resist coating/developing system provided with a heat processing unit that adopts a temperature control method according to an embodiment of the present invention.
Figure 2:
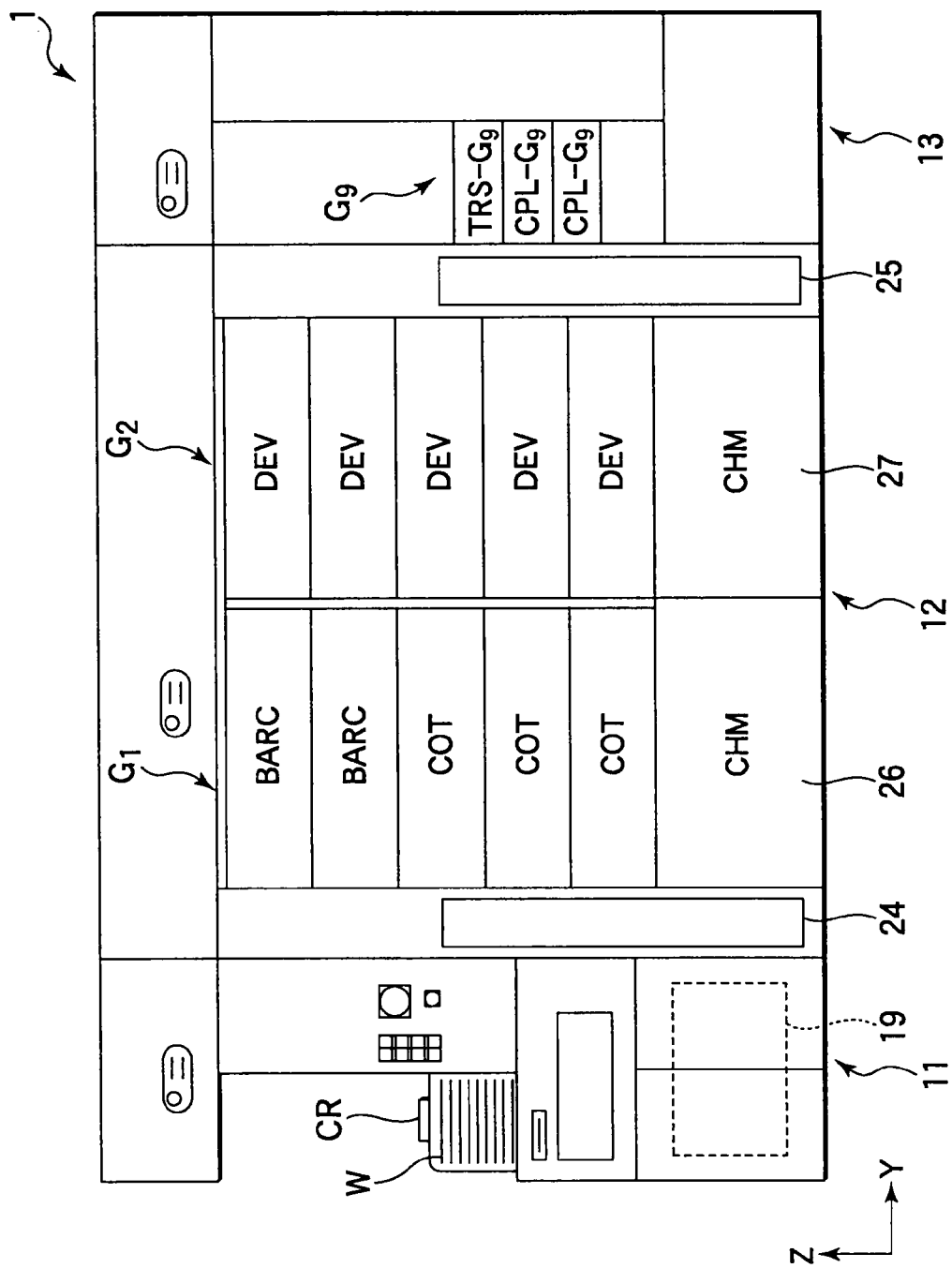
FIG. 2 is a front view of the resist coating/developing system shown in FIG. 1.
Figure 3:
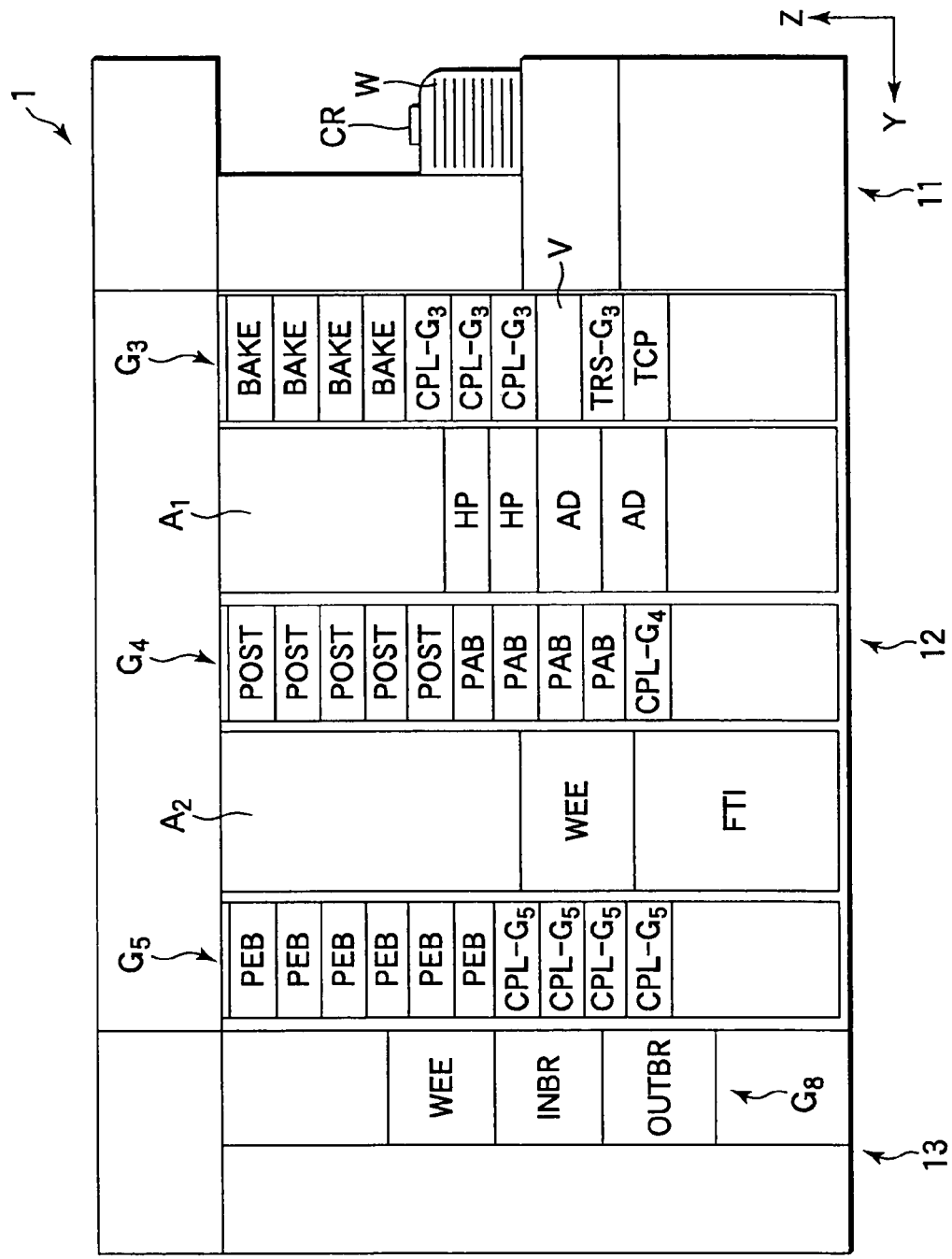
FIG. 3 is a back view of the resist coating/developing system shown in FIG. 1.

FIG. 1 is a plan view schematically showing a resist coating/developing system provided with a heat processing unit that adopts a temperature control method according to an embodiment of the present invention. FIGS. 2 and 3 are a front view and a back view, respectively, of the resist coating/developing system shown in FIG. 1.

This resist coating/developing system 1 includes a transfer station used as a cassette station 11, a process station 12 comprising a plurality of processing units, and an interface station 13 located adjacent to the process station 12 and configured to transfer wafers W between a light exposure apparatus 14 and the process station 12.

The cassette station 11 is used such that wafer cassettes (CR) are transferred thereto from other systems, wherein each of these wafer cassettes (CR) horizontally stores a plurality of wafers W to be processed in the resist coating/developing system 1. The cassette station 11 is also arranged such that wafer cassettes (CR) are transferred therefrom to other systems, wherein each of these wafer cassettes (CR) stores wafers W processed in the resist coating/developing system 1. Further, the cassette station 11 is used to transfer wafers W between the wafer cassettes (CR) and process station 12.

As shown in FIG. 1, the cassette station 11 includes a cassette table 20 having a plurality of (five in FIG. 1) positioning projections 20a formed thereon in a row in an X-direction. A wafer cassette (CR) is placed at each of the projections 20a such that its wafer transfer port faces the process station 12.

The cassette station 11 is provided with a wafer transfer mechanism 21 located between the cassette table 20 and process station 12. This wafer transfer mechanism 21 includes a wafer transfer pick 21a, which is movable in a cassette array direction (X-direction) and in a wafer array direction (Z-direction) of the wafers W stored in each wafer cassette (CR), and is further rotatable in a θ-direction show in FIG. 1. With the arrangement described above, the wafer transfer pick 21a can access any one of the wafer cassettes (CR), and also can access a transit unit (TRS-G$_3$) located in a third processing unit group G$_3$ of the process station 12 described later.

On the front side of the system, the process station 12 includes a first processing unit group G$_1$ and a second processing unit group G$_2$ arrayed in this order from the cassette station 11. Further, on the rear side of the system, the process station 12 includes a third processing unit group G$_3$, a fourth processing unit group G$_4$, and a fifth processing unit group G$_5$ arrayed in this order from the cassette station 11. A first main transfer section A$_1$ is interposed between the third processing unit group G$_3$ and fourth processing unit group G$_4$. A second main transfer section A$_2$ is interposed between the fourth processing unit group G$_4$ and fifth processing unit group G$_5$. A sixth processing unit group G$_6$ is located on the rear side of the first main transfer section A$_1$. A seventh processing unit group G$_7$ is located on the rear side of the second main transfer section A$_2$.

As shown in FIGS. 1 and 2, the first processing unit group G$_1$ includes five processing units of the spinner type stacked one on the other, which are used as liquid supply units each for performing a predetermined process on a wafer W placed on a spin chuck SP inside a cup (CP). For example, the five processing units are formed of three resist coating units (COT) and two bottom coating units (BARC) for forming an anti-reflective coating that prevents reflection of light during light exposure. The second processing unit group $G_2$ includes five processing units of the spinner type, such as developing units (DEV), stacked one on the other.

The third processing unit group $G_3$ includes ten units or the like stacked one on the other, as shown in FIG. 3, which are formed of a temperature adjusting unit (TCP), a transit unit (TRS-$G_3$), a spare space V, three high-precision temperature adjusting units (CPL-$G_3$), and four high-temperature heat processing units (BAKE) in this order from below. The transit unit (TRS-$G_3$) is used as a portion for transferring a wafer W between the cassette station 11 and first main transfer section $A_1$. The spare space V is used for attaching a desired processing unit of the oven type, such as a processing unit of the oven type for performing a predetermined process on a wafer W placed on a worktable. Each of the high-precision temperature adjusting units (CPL-$G_3$) is used for performing a heat process on a wafer W at a temperature controlled with high precision. Each of the high-temperature heat processing units (BAKE) is used for performing a predetermined heat process on a wafer W.

The fourth processing unit group $G_4$ includes ten units or the like stacked one on the other, as shown in FIG. 3, which are formed of a high-precision temperature adjusting unit (CPL-$G_4$), four pre-baking units (PAB), and five post-baking units (POST) in this order from below. Each of the pre-baking units (PAB) is used for performing a heat process on a wafer W after resist coating. Each of the post-baking units (POST) is used for performing a heat process on a wafer W after a developing process.

The fifth processing unit group $G_5$ includes ten units or the like stacked one on the other, as shown in FIG. 3, which are formed of four high-precision temperature adjusting units (CPL-$G_5$) and six post-exposure-baking units (PEB) in this order from below. Each of the post-exposure-baking units (PEB) is used for performing a heat process on a wafer W after light exposure and before development.

The high-temperature heat processing units (BAKE), pre-baking units (PAB), post-baking units (POST), and post-exposure-baking units (PEB) located in the third to fifth processing unit groups $G_3$ to $G_5$ have the same structure, as described later, which forms a heat processing unit according to this embodiment. In the third to fifth processing unit groups $G_3$ to $G_5$, the number and position of units stacked one on the other are not limited to those shown in the drawings, and they can be arbitrarily preset.

The sixth processing unit group $G_6$ includes four units or the like stacked one on the other, which are formed of two adhesion units (AD) and two heating units (HP) for heating a wafer W in this order from below. Each of the adhesion units (AD) may have a mechanism for adjusting the temperature of a wafer W. The seventh processing unit group $G_7$ includes two units or the like stacked one on the other, which are formed of a film thickness measuring unit (FTI) and a periphery light exposure unit (WEE) in this order from below. The film thickness measuring unit (FTI) is used for measuring the thickness of a resist film. The periphery light exposure unit (WEE) is used for performing light exposure selectively only on the edge portion of a wafer W. A plurality of periphery light exposure units (WEE) may be used and stacked one on the other. Further, on the rear side of the second main transfer section $A_2$, a heat processing unit, such as a heating unit (HP), may be disposed, as in the rear side of the first main transfer section $A_1$.

The first main transfer section $A_1$ is provided with a first main wafer transfer unit 16, which can selectively access the units located in the first processing unit group $G_1$, third processing unit group $G_3$, fourth processing unit group $G_4$, and sixth processing unit group $G_6$. The second main transfer section $A_2$ is provided with a second main wafer transfer unit 17, which can selectively access the units located in the second processing unit group $G_2$, fourth processing unit group $G_4$, fifth processing unit group $G_5$, and seventh processing unit group $G_7$.

Figure 4:
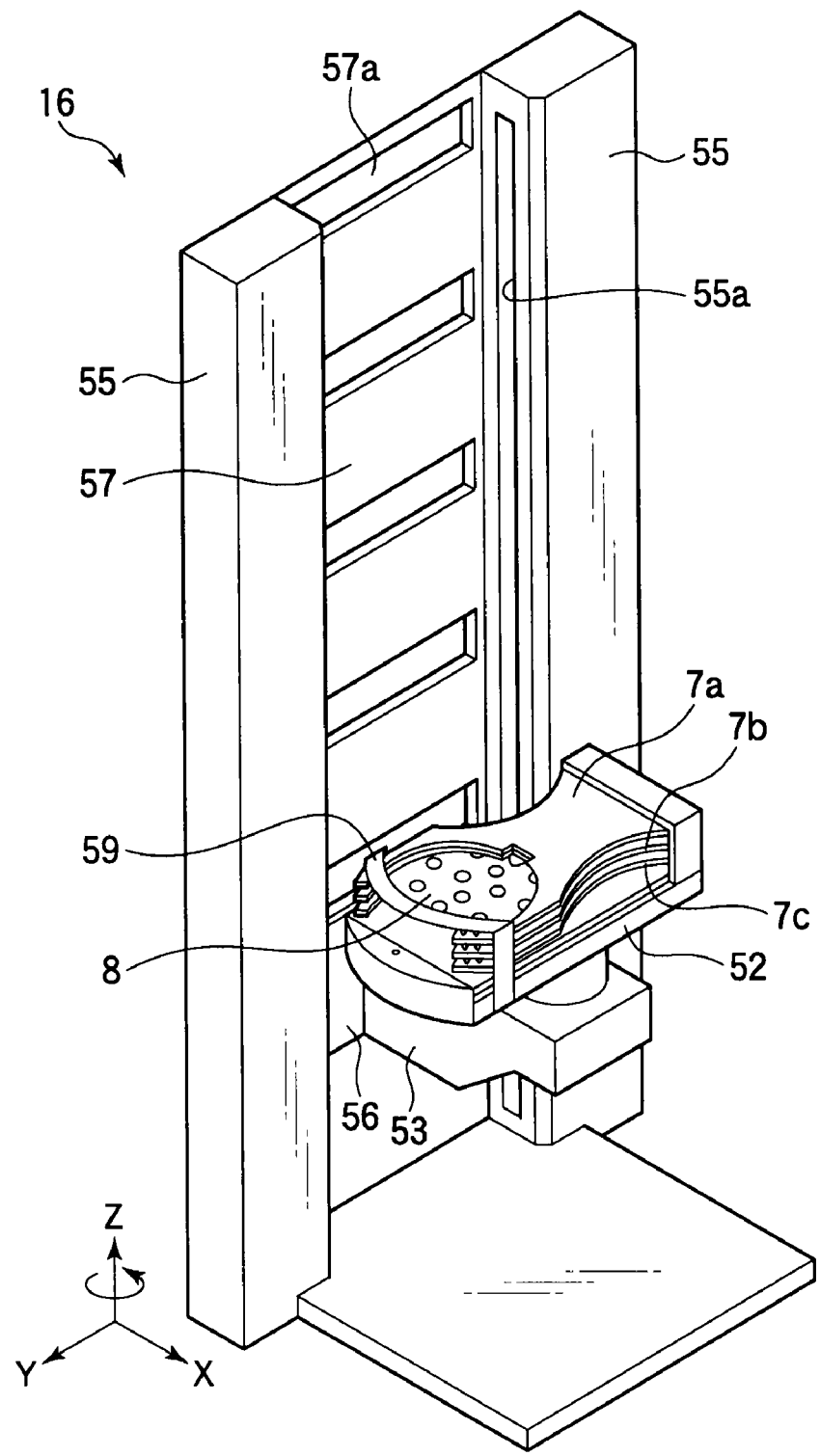
FIG. 4 is a perspective view schematically showing the structure of a main wafer transfer unit used in the resist coating/developing system shown in FIG. 1.

As shown in FIG. 4, the first main wafer transfer unit 16 includes three arms 7a, 7b, and 7c each for holding a wafer W. These arms 7a to 7c are movable back and forth along a base plate 52. The base plate 52 is rotatably supported by a support portion 53 and can be rotated by a motor built in the support portion 53. The support portion 53 is movable up and down along support struts 55 extending in the vertical direction. The support struts 55 are respectively provided with sleeves 55a extending in a vertical direction, while a flange portion 56 laterally projected from the support portion 53 slidably engages with sleeves 55a. The support portion 53 can be moved up and down by an elevating mechanism (not shown) through the flange portion 56. With this arrangement, the arms 7a to 7c of the first main wafer transfer unit 16 are movable in the X-direction, Y-direction, and Z-direction, and is rotatable in the X-Y plane. Consequently, as described above, the first main wafer transfer unit 16 can selectively access the units located in the first processing unit group $G_1$, third processing unit group $G_3$, fourth processing unit group $G_4$, and sixth processing unit group $G_6$.

A shield plate 8 is attached between the arm 7a and arm 7b to block off radiation heat from these arms. Further, a light emitting element (not shown) of a sensor member 59 is located above the distal end of the uppermost arm 7a, while a light receiving element (not shown) is attached at the distal end of the base plate 52. The light emitting element and light receiving element constitute an optical sensor to confirm the presence/absence and protruding of a wafer W on each of the arms 7a to 7c. FIG. 4 also shows a wall portion 57 as a part of the housing of the first main transfer section $A_1$ on the first processing unit group $G_1$ side. The wall portion 57 has window portions 57a formed therein, through which a wafer W is transferred to and from the respective units of the first processing unit group $G_1$. The second main wafer transfer unit 17 has the same structure as that of the first main wafer transfer unit 16.

A liquid temperature adjusting pump 24 and a duct 28 are located between the first processing unit group $G_1$ and cassette station 11. A liquid temperature adjusting pump 25 and a duct 29 are located between the second processing unit group $G_2$ and interface station 13. The liquid temperature adjusting pumps 24 and 25 are used for supplying predetermined process liquids to the first processing unit group $G_1$ and second processing unit group $G_2$, respectively. The ducts 28 and 29 are used for supplying clean air into the processing unit groups $G_1$ to $G_5$ from an air conditioner (not shown) located outside the resist coating/developing system 1.

The first to seventh processing unit groups $G_1$ to $G_7$ are detachable for a maintenance operation. The rear side panel of the process station 12 is also detachable or openable. Further, chemical units (CHM) 26 and 27 are respectively located below the first processing unit group $G_1$ and second processing unit group $G_2$ and are used for supplying predetermined process liquids to the first processing unit group $G_1$ and second processing unit group $G_2$.

The interface station 13 comprises a first interface station 13a on the process station 12 side, and a second interface station 13b on the light exposure apparatus 14 side. The first interface station 13a is provided with a first wafer transfer device 62 that faces an opening of the fifth processing unit group $G_5$. The second interface station 13b is provided with a second wafer transfer device 63 movable in the X-direction.

An eighth processing unit group $G_8$ is located on the rear side of the first wafer transfer device 62. The eighth processing unit group $G_8$ includes units or the like stacked one on the other, as shown in FIG. 3, which are formed of an outgoing buffer cassette (OUTBR), an incoming buffer cassette (INBR), and a periphery light exposure unit (WEE) in this order from below. The outgoing buffer cassette (OUTBR) is used for temporarily placing wafers W transferred from the light exposure apparatus 14. The incoming buffer cassette (INBR) is used for temporarily placing wafers W to be transferred into the light exposure apparatus 14. Each of the incoming buffer cassette (INBR) and outgoing buffer cassette (OUTBR) is configured to accommodate a plurality of, e.g., 25, wafers W. Further, a ninth processing unit group $G_9$ is located on the front side of the first wafer transfer device 62. The ninth processing unit group $G_9$ includes units or the like stacked one on the other, as shown in FIG. 2, which are formed of two high-precision temperature adjusting units (CPL-$G_9$) and a transit unit (TRS-$G_9$) in this order from below.

The first wafer transfer device 62 includes a wafer transfer fork 62a, which is movable in the Z-direction, rotatable in the θ-direction, and further movable back and forth in the X-Y plane. This fork 62a can selectively access the units located in the fifth processing unit group $G_5$, eighth processing unit group $G_8$, and ninth processing unit group $G_9$, so that wafers W can be transferred among these units.

Similarly, the second wafer transfer device 63 includes a wafer transfer fork 63a, which is movable in the X-direction and Z-direction, rotatable in the θ-direction, and further movable back and forth in the X-Y plane. This fork 63a can selectively access the units located in the ninth processing unit group $G_9$, and an incoming stage 14a and an outgoing stage 14b of the light exposure apparatus 14, so that wafers W can be transferred among these portions.

Figure 5:
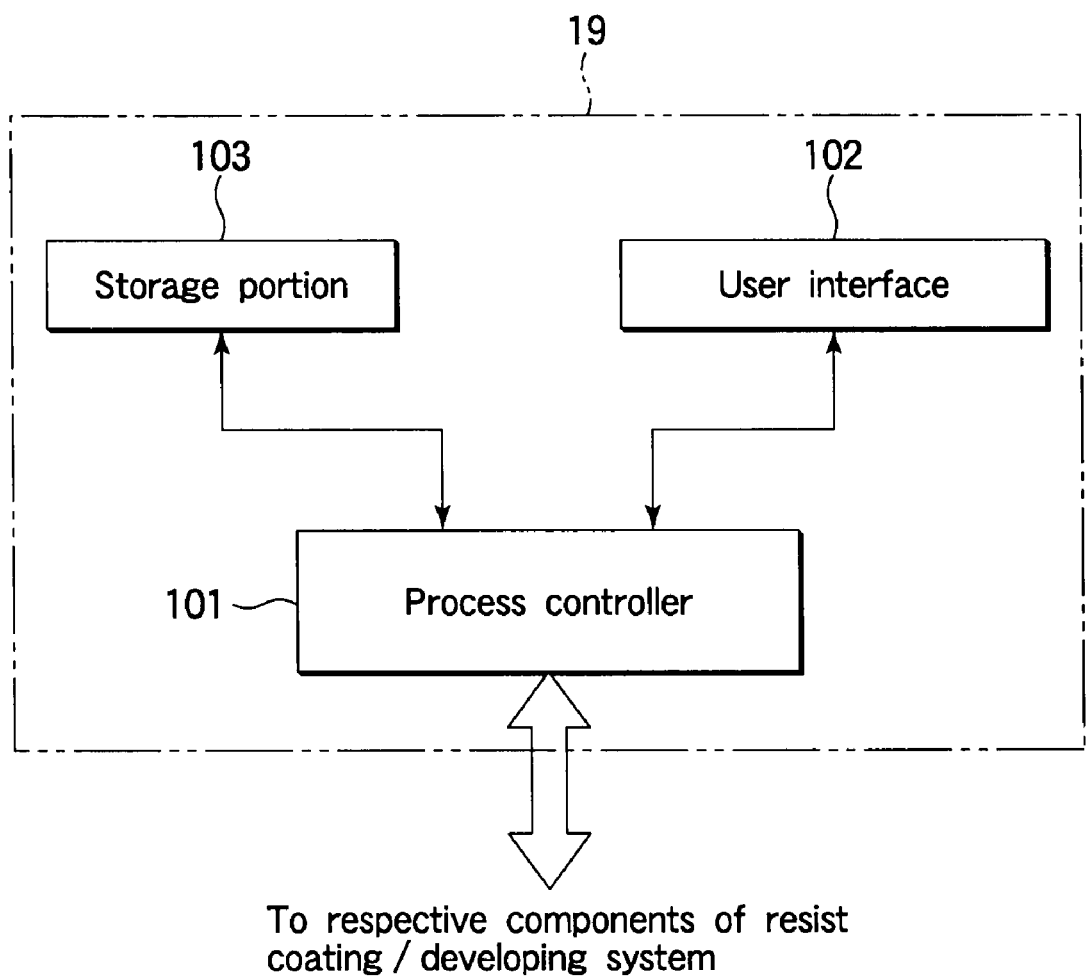
FIG. 5 is a block diagram showing a control system used in the resist coating/developing system shown in FIG. 1.

As shown in FIG. 2, a central control section 19 is located below the cassette station 11 and is used for controlling this resist coating/developing system 1, as a whole. As shown in FIG. 5, this central control section 19 includes a process controller 101 comprising a CPU for controlling the respective components included in the resist coating/developing system 1, such as the processing units and transfer mechanisms. The process controller 101 is connected to the user interface 102, which includes, e.g., a keyboard and a display, wherein the keyboard is used for a process operator to input commands for operating the respective components in the resist coating/developing system 1, and the display is used for showing visualized images of the operational status of the respective components in the resist coating/developing system 1. Further, the process controller 101 is connected to a storage portion 103 that stores various databases and recipes, i.e., control programs for the process controller 101 to control the resist coating/developing system 1 so as to perform various processes, and control programs for the respective components of the resist coating/developing system 1 to perform predetermined processes in accordance with process conditions. The recipes are stored in a storage medium included in the storage portion 103. The storage medium may be formed of a medium of the stationary type, such as a hard disk, or a medium of the portable type, such as a CDROM, DVD, or flash memory. Alternatively, the recipes may be used online while they are transmitted from another apparatus through, e.g., a dedicated line, as needed.

A required recipe is retrieved from the storage portion 103 and executed by the process controller 101 in accordance with an instruction or the like input through the user interface 102. Consequently, the resist coating/developing system 1 can perform a predetermined process under the control of the process controller 101.

In the resist coating/developing system 1 arranged as described above, unprocessed wafers W are taken out one by one from a wafer cassette (CR) by the wafer transfer mechanism 21. A wafer W thus taken out is transferred by the wafer transfer mechanism 21 into the transit unit (TRS-$G_3$) located in the processing unit group $G_3$ of the process station 12. Then, the wafer W receives a temperature adjusting treatment in the temperature adjusting unit (TCP). Then, the wafer W is sequentially subjected to formation of an anti-reflective coating performed by one of the bottom coating units (BARC) of the first processing unit group $G_1$, a heat process performed by one of the heating units (HP), and a baking process performed by one of the high-temperature heat processing units (BAKE). Before the formation of an anti-reflective coating performed by one of the bottom coating units (BARC), the wafer W may be subjected to an adhesion process performed by one of the adhesion units (AD). Then, the wafer W receives a temperature adjusting treatment in the high-precision temperature adjusting unit (CPL-$G_4$). Then, the wafer W is transferred into one of the resist coating unit (COT) located in the first processing unit group $G_1$, in which the wafer W is subjected to a process for applying a resist liquid. Thereafter, the wafer W is sequentially subjected to a pre-baking process performed by one of the pre-baking units (PAB) located in the fourth processing unit group $G_4$, and a periphery light exposure process performed by one of the periphery light exposure units (WEE). Then, the wafer W receives a temperature adjusting treatment in the high-precision temperature adjusting unit (CPL-$G_4$) or the like. Thereafter, the wafer W is transferred by the second wafer transfer device 63 into the light exposure apparatus 14. After the wafer W is subjected to a light exposure process performed by the light exposure apparatus 14, the wafer W is transferred by the second wafer transfer device 63 into the transit unit (TRS-$G_9$). Then, the wafer W is transferred by the first wafer transfer device 62 into one of the post-exposure-baking units (PEB) located in the fifth processing unit group $G_5$, in which the wafer W is subjected to a post-exposure-baking process. Further, the wafer W is transferred into one of the developing units (DEV) located in the second processing unit group $G_2$, in which the wafer W is subjected to a developing process. Then, the wafer W is subjected to a post-baking process performed by the post-baking unit (POST) Then, the wafer W receives a temperature adjusting treatment in one of the high-precision temperature adjusting units (CPL-$G_3$). Then, the wafer W is transferred by the transit unit (TRS-$G_3$) to a predetermined position in a wafer cassette (CR) placed on the cassette station 11.

Figure 6:
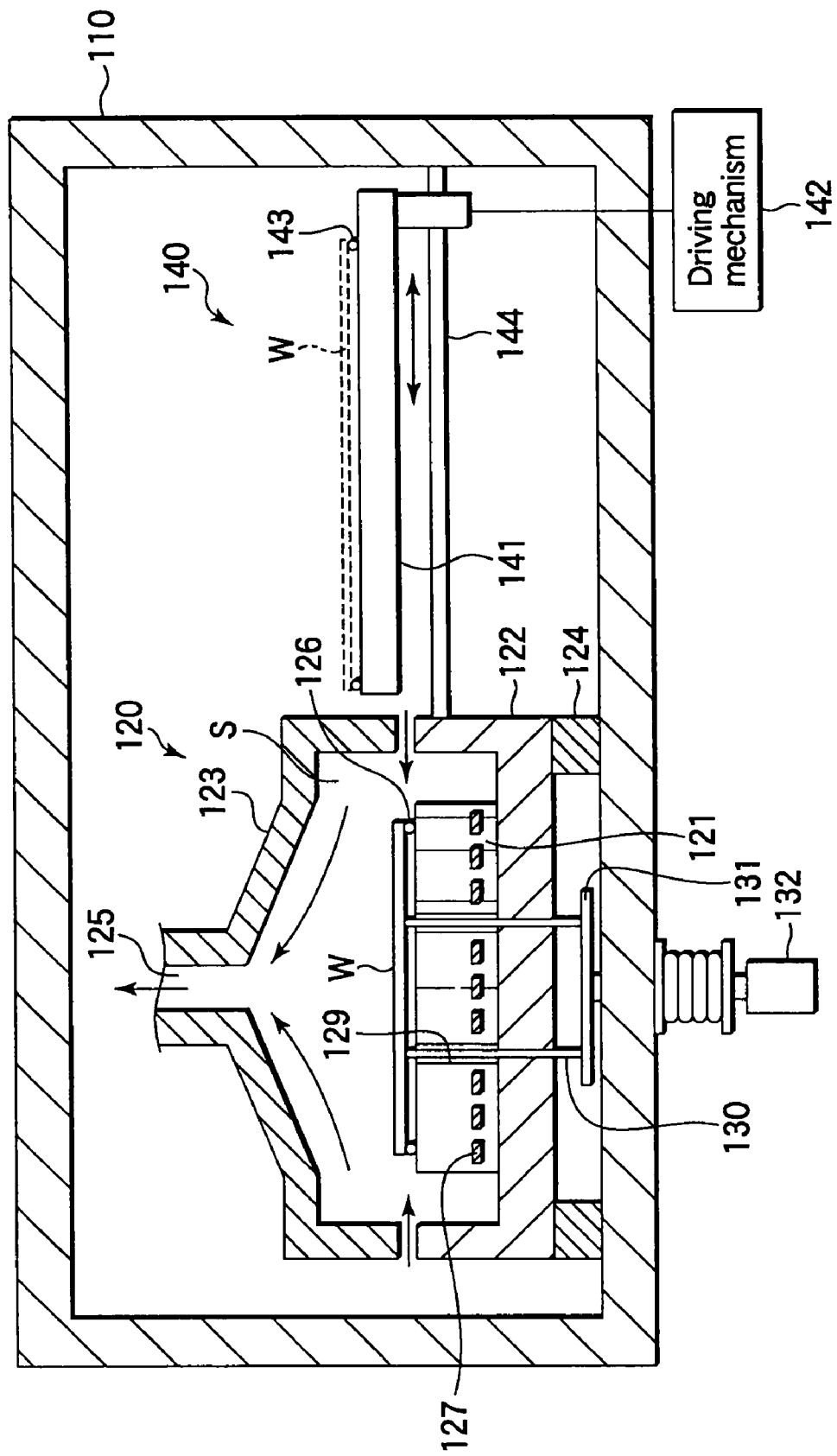
FIG. 6 is a sectional view showing a heat processing unit that performs a temperature control method according to an embodiment of the present invention.
Figure 7:
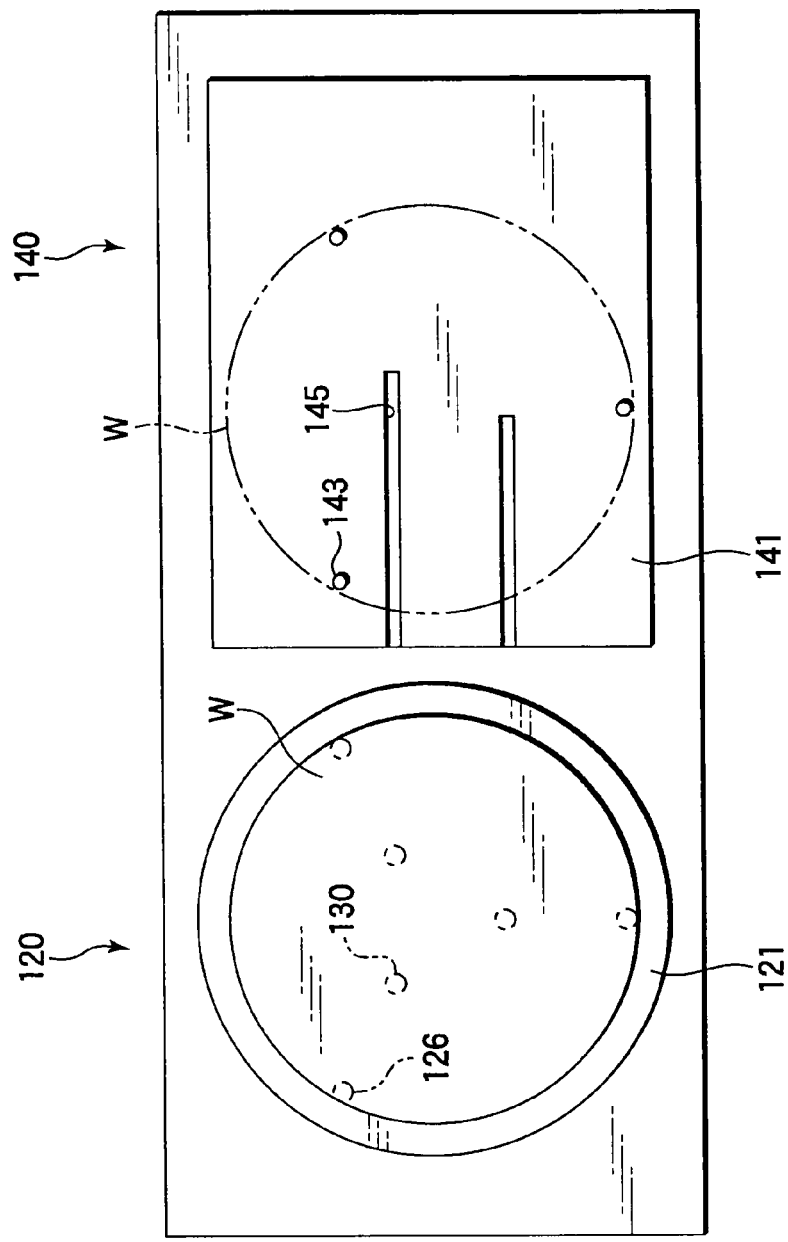
FIG. 7 is a plan view schematically showing the interior of the heat processing unit that performs a temperature control method according to an embodiment of the present invention.

Next, a detailed explanation will be given of the heat processing unit that adopts a control method according to an embodiment of the present invention. As described above, the high-temperature heat processing units (BAKE), pre-baking units (PAB), post baking units (POST), and post-exposure-baking units (PEB) have the same structure, which forms a heat processing unit according to this embodiment, i.e., a heat processing unit (CHP) provided with a cooling function. FIG. 6 is a sectional view showing the heat processing unit (CHP). FIG. 7 is a plan view schematically showing the interior of the heat processing unit.

This heat processing unit (CHP) includes a casing 110, in which a heating section (heat processing section) 120 is located on one side, and a cooling section 140 is located on the other side.

The heating section (heat processing section) 120 is used for performing a baking process after light exposure, by heating a wafer W, and includes a hot plate 121 like a circular plate for heating a wafer W. The hot plate 121 is supported within the inner space of a support member 122 having a compressed cylindrical shape opened upward. The upper side of the support member 122 is covered with a cover 123 having a conical shape gradually increasing the height from the periphery toward the center. The cover 123 has an exhaust port 125 connected to an exhaust line at the top of the center. The cover 123 can be moved up and down by an elevating mechanism (not shown). When the cover 123 is set at the upper position, the wafer W can be loaded and unloaded to and from the hot plate 121. When the cover 123 is set at the lower position, the lower end of the cover 123 comes into close contact with the upper end of the support member 122 to form a heat processing space S. The support member 122 is fixed on a spacer 124 placed on the bottom of the casing 110.

The hot plate 121 is made of, e.g., aluminum, and is provided with proximity pins 126 on the surface. The wafer W is placed on the proximity pins 126 to be adjacent to the hot plate 121. The hot plate 121 has a heater 127 built therein, which is formed of a plurality of channels as described later. When electricity is applied to the respective channels of the heater 127, the respective channels of the hot plate 121 are heated to predetermined temperatures.

The hot plate 121 has three through holes 129 formed therein at the central portion (only two of them are shown in FIG. 6). Lifter pins 130 are respectively inserted in these through holes 129 and are movable up and down to move the wafer W up and down. The lifter pins 130 are attached to a support plate 131 and are moved up and down along with the support plate 131 by a cylinder mechanism 132 located below the casing 110.

The cooling section 140 is used for cooling the wafer W after it is heated by the heating section 120, so that the wafer W is set at a predetermined temperature. The cooling section 140 includes a cooling plate 141 provided with a coolant passage (not shown), and a driving mechanism 142 for moving the cooling plate 141 in a horizontal direction to transfer the wafer W between the cooling section 140 and heating section 120. The cooling plate 141 is provided with proximity pins 143 thereon, so that the wafer W is placed on the proximity pins 143 to be adjacent to the cooling plate 141 during a cooling process. The driving mechanism 142 comprises a suitable mechanism, such as a belt mechanism or ball screw mechanism, to move the cooling plate 141 along a guide 144. When the wafer W is transferred to and from the hot plate 121, the cooling plate 141 is moved to the heating section (heat processing section) 120 side. When a cooling process is performed, the cooling plate 141 is set at a reference position shown in FIG. 6. In order to prevent the cooling plate 141 thus moved from interfering with the lifter pins 130, the cooling plate 141 has grooves 145 extending in a transfer direction of the cooling plate 141, as shown in FIG. 7.

Figure 8:
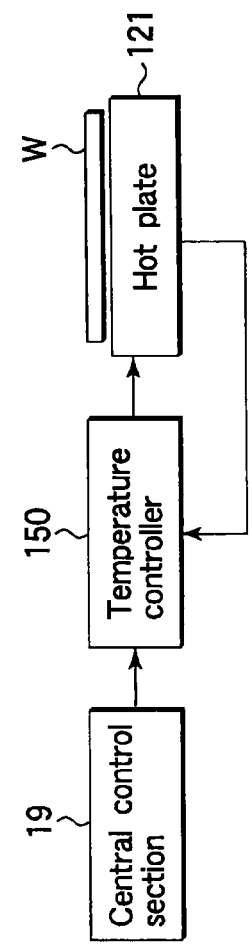
FIG. 8 is a block diagram showing a temperature control mechanism used in the heat processing unit.

Next, an explanation will be given of a temperature control mechanism used for the hot plate 121 of the heat processing unit (CHP), with reference to the block diagram shown in FIG. 8. As shown in FIG. 8, a temperature controller 150 is disposed to adjust the temperature of the hot plate 121 for performing a heat process on a target object or wafer W. The temperature controller 150 is connected to the central control section 19 serving as a host controller, and performs a PID calculation and the like based on the deviation between a target temperature predetermined by the central control section and a detected temperature from a sensor (not shown) disposed near the surface of the hot plate 121. The temperature controller 150 then outputs an operation amount to an SSR (solid state relay) or magnetic switch (not shown) and the like to control a supply current to a heater (not shown) arranged on the hot plate 121, so that the temperature of the hot plate 121 becomes the target temperature.

Where a number of wafers W are heat-processed by the hot plate 121, the wafers W are sequentially loaded onto the hot plate 121 one by one by a main wafer transfer unit, then subjected to a heat process for a constant time period, and then unloaded from the hot plate 121.

Figure 9:
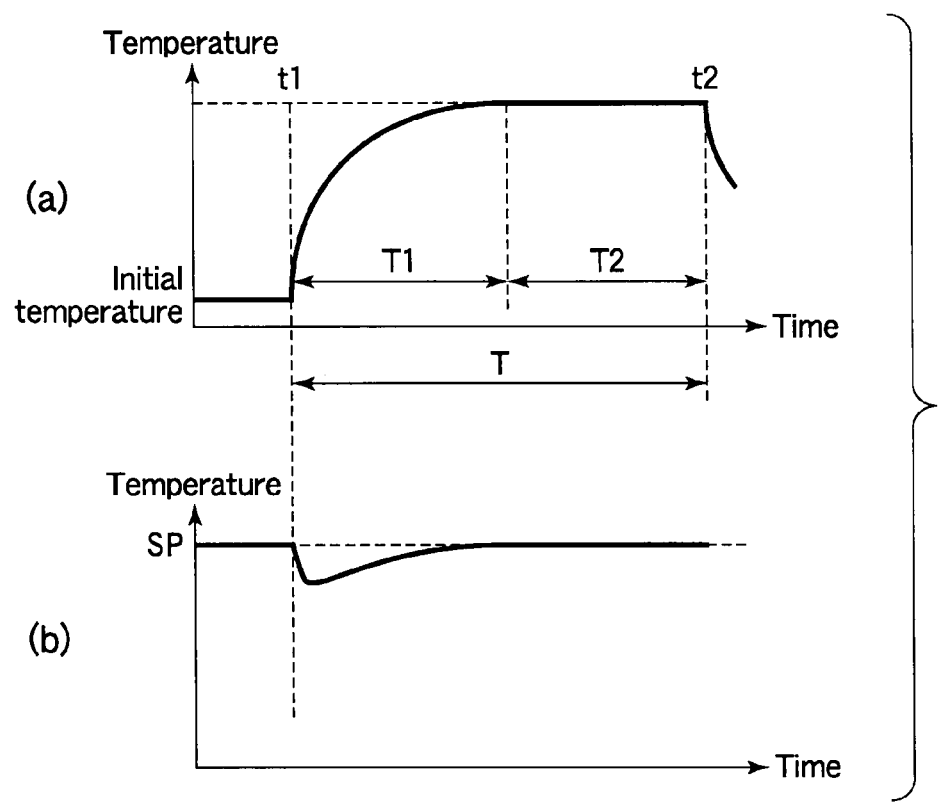
FIG. 9 is a view showing changes in the temperature of a wafer and a hot plate on which the wafer is placed in the heat processing unit.

FIG. 9 is a view showing changes in the temperature of a wafer and the temperature of the hot plate 121 controlled by the temperature controller 150, in a heat process of this kind. FIG. 9-(a) shows a change in the temperature of the wafer while FIG. 9-(b) shows a change in the temperature of the hot plate as a control target.

As shown in FIG. 9-(b), when the wafer W is placed at a time point t1 on the hot plate 121 adjusted at a target temperature SP, the wafer W takes heat from the hot plate 121. The temperature of the hot plate 121 is thus decreased temporarily, and then gradually returned to the target temperature SP.

On the other hand, as shown in FIG. 9-(a), the temperature of the wafer W starts being gradually increased from the time point t1 of loading thereof onto the hot plate 121, then stabilized around the target temperature, and then decreased by unloading thereof from the hot plate 121 at a time point t2.

Accordingly, in order to perform a heat process uniformly on a number of wafers W so as to decrease the variations in the property and/or quality of the semiconductor wafers, the stable temperature times T2 of the wafers W, in which the temperature thereof is stable around the target temperature, are preferably set constant.

In this heat processing unit, a process is controlled to set constant the time T from the time point t1 of loading of the wafer W onto the hot plate 121 to the time point t2 of unloading of the wafer W from the hot plate 121. In this case, in order to make the stable temperature times T2 constant, reaching times (temperature increase times) T1 need to be set constant, wherein the reaching time T1 is defined by a time period for increasing the temperature of a wafer from an initial temperature before staring the process to a temperature around the target temperature.

In light of this, according to this embodiment, the temperature increase times T1 of the heat processing units are controlled to be a common target temperature increase time. With this arrangement, the temperature increase times T1 of the heat processing units are prevented from differing from each other due to variations in component parts and/or installation ambiences, so that the wafers are uniformly processed by the heat process.

Specifically, as regards the temperature increase time T1 defined by a time period for increasing the temperature of a wafer W from an initial temperature (first temperature) before staring the heat process to a stable process temperature (second temperature) corresponding to the target temperature of hot plate 121, the target temperature is adjusted after staring the process, so that the target temperature increase times of the heat processing units are set constant. The process temperature is defined by a temperature at which the temperature of a wafer W is stabilized around the target temperature after staring the process. At this time, the temperature of the hot plate 121 is stable at the target temperature.

In the temperature control method according to this embodiment, adjustment data for adjusting a target temperature is acquired in advance for each heat processing unit. Then, in actual use for sequentially heat-processing a number of wafers, the target temperature is adjusted when the heat process is performed on each wafer, in accordance with the adjustment data acquired for each heat processing unit.

Figure 10:
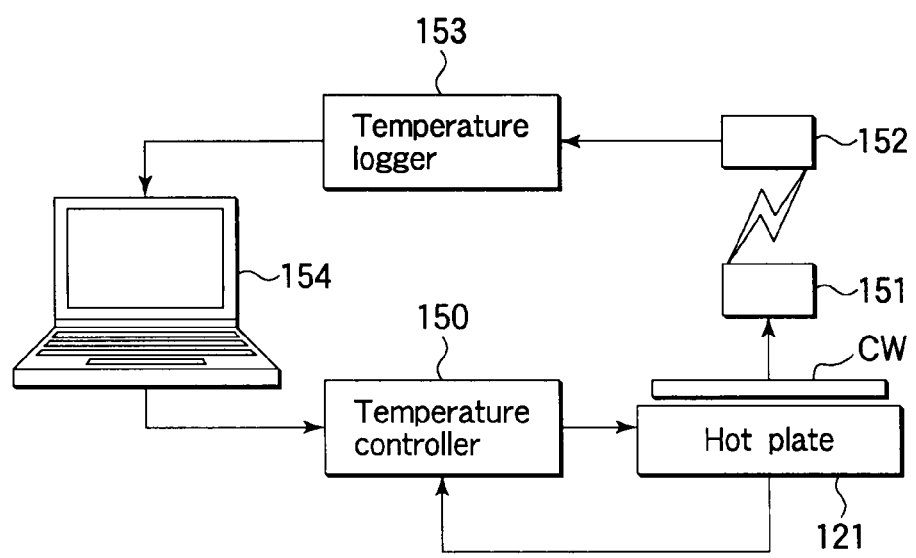
FIG. 10 is a view showing a system constitution to measure the temperature of the test wafer and control the temperature of a hot plate based thereon.

FIG. 10 shows an example of a constitution to acquire, in advance, adjustment data for adjusting a target temperature. In FIG. 10, the same constituent elements in FIG. 8 are denoted by the same reference numerals. As shown in FIG. 10, a test wafer CW provided with temperature sensors (not shown) is placed on a hot plate 121. The test wafer CW is the same as an ordinary wafer shown in FIG. 8 except for the temperature sensors attached thereon. A temperature logger 153 is disposed to measure temperature in response to a detection signal from the temperature sensors of the test wafer CW. A personal computer 154 serving as a host controller is connected to the temperature logger 153 and temperature controller 150.

The personal computer 154 is used only for a temperature adjusting operation, but has the all or part of the functions of the central control section 19. In temperature adjustment, the personal computer 154 can change the target temperature of the temperature controller 150 by communication with the temperature logger 153 and temperature controller 150. The personal computer 154 can measure the target temperature and the temperature of the test wafer CW synchronously. In place of the personal computer 154, a PLC (Programmable Logic Controller) may be used for the same purpose, or the central control section 19 may be used to perform direct control for the same purpose.

The plurality of temperature sensors of the test wafer CW are connected to a transmitter 151 through signal lines. The test wafer CW and transmitter 151 are placed inside dedicated ports (not shown) in the cassette station 11 of the resist coating/developing system 1, and are transferred by the wafer transfer mechanism 21 and first main transfer unit 16 or second main transfer unit to a heat processing unit to be subjected to temperature control when temperature measurement is performed. At this time, only the test wafer CW is placed on the hot plate 121, and the transmitter 151 is left on the transfer unit or placed on a dedicated port located outside the casing of the heat processing unit.

On the other hand, the temperature logger 153 is connected to a receiver 152 for receiving detection signals from the temperature sensors of the test wafer CW transmitted from the transmitter 151 by radio, and sending the signals to the temperature logger 153.

The personal computer 154 is provided with a storage medium set therein, such as a CD-ROM, which stores control programs for performing predetermined control, and reads and executes a program stored in the storage medium, so that it serves as a calculating device for performing predetermined calculation. Where the central control section 19 is used in place of the personal computer 154 for the same purpose, a storage medium of this kind is set in the storage portion 103.

Next an explanation will be given of a sequential flow for acquiring adjustment data in the system described above, with reference to the flow chart shown in FIG. 11.

At first, as regards adjustment of temperature increase time (recovery time: RT) for increasing the temperature from an initial temperature to a temperature around a target temperature, a heat processing unit to adopt the adjustment is selected. Then, in this unit, the test wafer CW is placed on the hot plate 121 and is subjected to a heat process for a certain time T under the same conditions as in actual use before adjustment, while the temperature of the test wafer CW is measured (Step 1).

In this respect, where before-adjustment data is acquired, planar offset adjustment under a steady stable state is preferably performed in advance by use of the test wafer CW for measurement. The offset adjustment is adjustment of the set temperature for heating a wafer, such that the average temperature is adjusted at a predetermined elapsed time point after the wafer is placed on the hot plate 121. Unless such offset adjustment is performed, the arrival temperatures of wafers differ from each other and make it difficult to calculate exact RT, due to individual differences of hardwares including hot plates and/or ambience differences.

Then, based on the temperature profile of the test wafer CW, as shown in FIG. 9-(a), measured in Step 1, a before-adjustment RT (temperature increase time T1) is calculated (Step 2).

The method for calculating the before-adjustment RT is important, because, if the calculation results of the before-adjustment RT are not the same among the measuring operations and/or heat processing units, adjustment results obtained thereafter and eventual quality may vary. In order to decrease the variations at this time, it is important to exactly determine the timing of temperature increase start after loading of the wafer onto the hot plate 121. For this purpose, any one of the following methods may be effectively employed.

(1) The average value of a wafer temperature profile is approximated by a polynomial equation of quintic or a higher degree, and the maximum point of the temperature increase rate is set as a reference for the timing of temperature increase start.

(2) The start point of increase in the temperature of the wafer caused upon loading of the wafer onto the hot plate 121 is set as a reference for the timing of temperature increase start.

(3) A time point when the temperature increase rate exceeds a predetermined value, typically several ° C./sec, in the average value of a wafer temperature profile is set as a reference for the timing of temperature increase start.

(4) The temperature decrease start point at the end of the heat process is used as a reference, from which the timing of temperature increase start is calculated by an inverse operation.

Of these methods (1) to (4), the methods (2) and (3) are commonly used, but they entail variations to some extent, and thus require an improvement in precision. On the other hand, as in the method (1), where the average value of a wafer temperature profile is approximated by a polynomial equation of quintic or a higher degree, a high precision can be attained. The method (4) is preferable as an idealistic theory, but entails some difficulty in actual use. Accordingly, of these methods, the method (1) is most preferable. With Steps 1 and 2 described above, the first stage or pre-adjustment stage is completed.

Then, the second stage or actual adjustment stage is executed. In the second stage, at first, the time difference $\Delta t$ between the before-adjustment RT, i.e., the temperature increase time T1, measured and calculated in Step 2 and a preset target RT is calculated (Step 3). Then, the time difference $\Delta t$ thus calculated is transmitted to the temperature controller 150 (Step 4). In the temperature controller 150, by use of a relation formula $b=f(\Delta t)$, acquired in advance, showing the relation between the time difference $\Delta t$ and the adjustment value "b" used as adjustment data, an adjustment value "b" corresponding to the calculated time difference $\Delta t$ is calculated (Step 5). Then, by use of the adjustment value "b" thus obtained, Steps 1 to 5 described above are repeated. Steps 1 to 5 described above are repeated a plurality of times, such as three times in the embodiment, to finalize this issue. The temperature controller 150 stores this adjustment value "b" to correspond to a use condition in the storage portion. Then, in actual use, adjustment is performed in accordance with an adjustment value "b" corresponding to a use condition, as described later.

Figure 11:
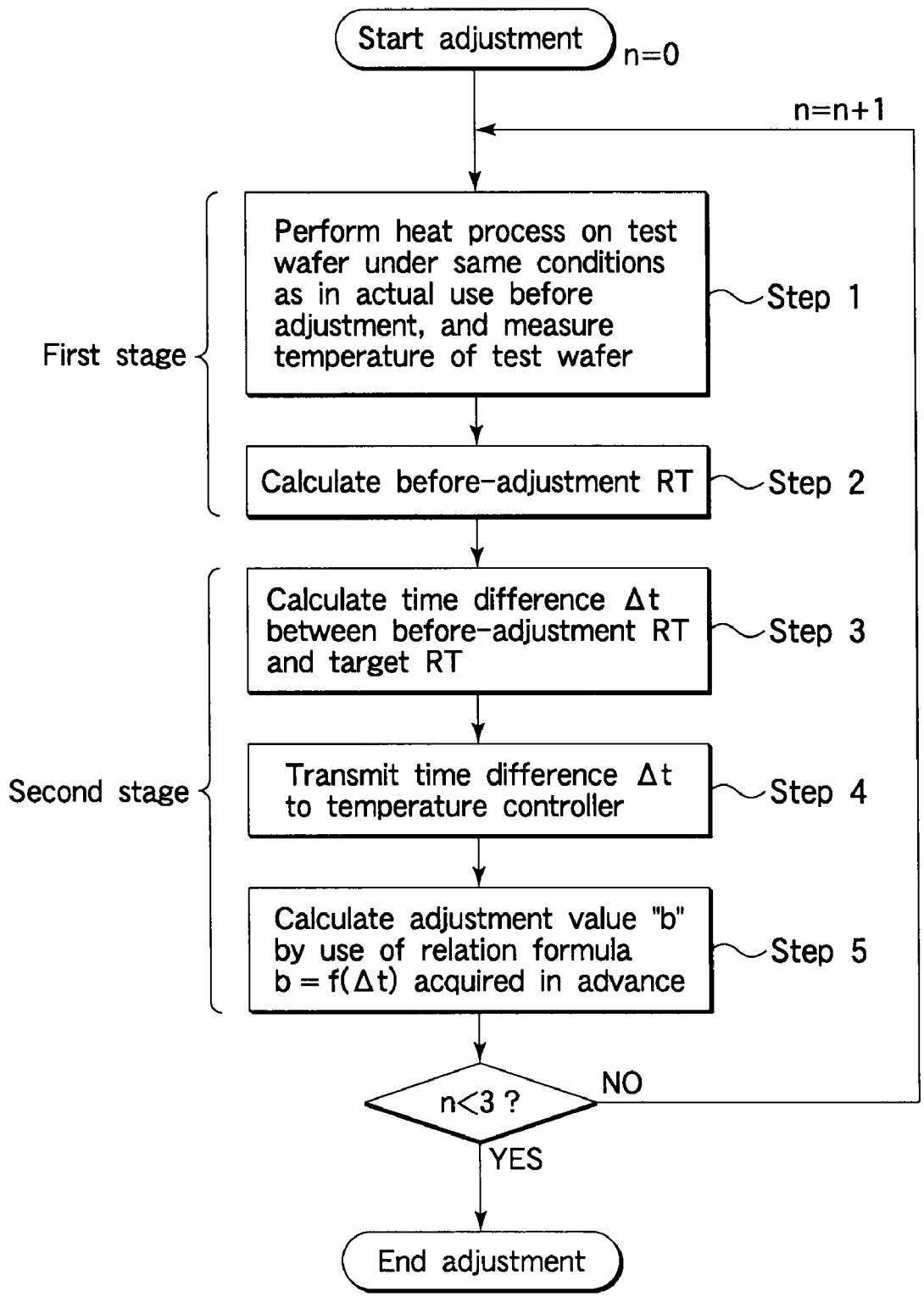
FIG. 11 is a flow chart showing a sequential flow for acquiring an adjustment value "b" by use of the system shown in FIG. 10.

The sequential flow shown in FIG. 11 for acquiring an adjustment value "b" for each of a plurality of heat processing units disposed in the system and for each of use conditions (ambient conditions, such as temperature ranges).

The target RT described above is preferably obtained and applied in accordance with temperature ranges for processing a wafer. Specifically, for this purpose, any one of the following methods may be preferably employed to determine the target RT.

(a) The values are arbitrarily set in accordance with process conditions (resist properties).

(b) Standard values are preset for respective temperature ranges in accordance with the "hot plate vs. wafer" characteristic.

Next, an explanation will be given of actual use after an adjustment value "b" is determined.

In actual use of the adjustment value "b" thus determined, the temperature controller 150 adjusts the target temperature in accordance with the determined adjustment value "b", as follows.

Figure 12:
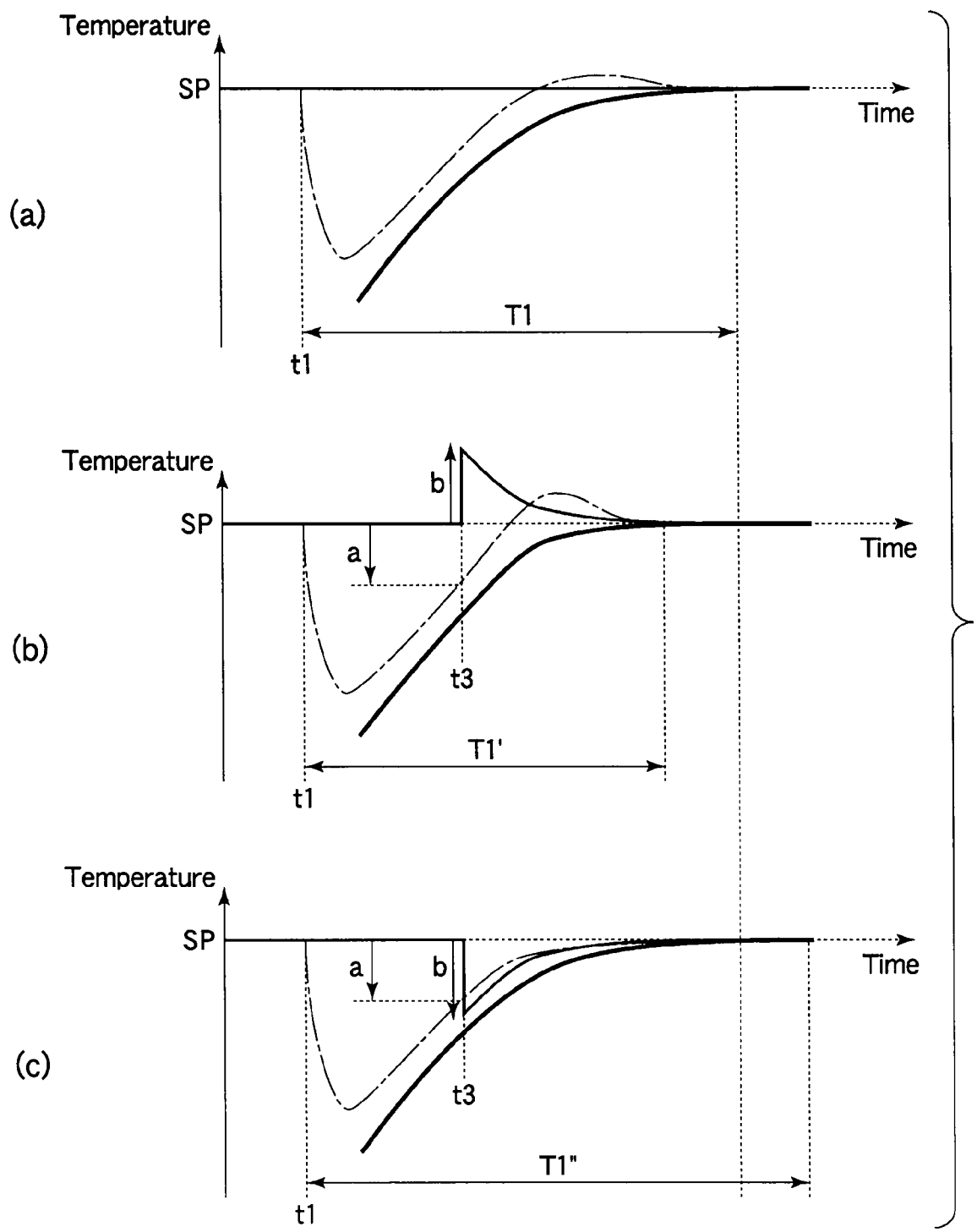
FIG. 12 is a view showing changes in the temperature of a wafer and a hot plate before and after adjustment, for explaining adjustment of a target temperature in actual use.

FIG. 12 is a view showing changes in the temperature of the target temperature, wafer W, and hot plate 121 for explaining adjustment of the target temperature. FIG. 12-(a) shows data before adjustment, FIG. 12-(b) shows data where adjustment was performed to decrease RT (temperature increase time), and FIG. 12-(c) shows data where adjustment was performed to increase RT. In FIG. 12, the thick solid line denotes the temperature of the wafer W, the thin solid line denotes the target temperature SP, and the chain line denotes the temperature of the hot plate 121.

As described above, the target temperature increase time is a constant time common to the respective heat processing units. However, for the sake of convenience, as compared to the temperature increase time before adjustment shown in FIG. 12-(a), FIG. 12-(b) shows the target temperature increase time as being shorter, and FIG. 12-(c) shows the target temperature increase time as being longer. Further, FIG. 12 is an enlarged view only of a main portion and thus excludes a portion around the initial temperature of the wafer W, which is the same as the temperature change shown in FIG. 9 described above.

Where the before-adjustment RT or temperature increase time T1 is in the state shown in FIG. 12-(a) and is longer than the target RT, an operation is performed as shown in FIG. 12-(b). Specifically, at a time point t3 when the detected temperature of the hot plate 121 returns to a temperature "a"° C.—lower than the target temperature after the wafer W is placed on the hot plate 121 and the heat process is started, the target temperature SP is increased by the adjustment value "b"° C., and then returned to the target temperature SP by primary damping with a certain time constant.

Consequently, the before-adjustment RT or before-adjustment temperature increase time T1 shown in FIG. 12-(a) becomes shorter as in the after-adjustment RT or after-adjustment temperature increase time T1' shown in FIG. 12-(b), so that it is adjusted to a time the same as or close to the preset target RT.

On the other hand, where the before-adjustment RT or temperature increase time T1 is in the state shown in FIG. 12-(a) and shorter than the target RT, an operation is performed as shown in FIG. 12-(c). Specifically, at a time point t3 when the detected temperature of the hot plate 121 returns to a temperature "a'"° C.—lower than the target temperature after the wafer W is placed on the hot plate 121 and the heat process is started, the target temperature SP is decreased by the adjustment value "b'"° C., and then returned to the target temperature SP by primary damping with a certain time constant.

Consequently, the before-adjustment RT or before-adjustment temperature increase time T1 shown in FIG. 12-(a) becomes longer as in the after-adjustment RT or after-adjustment temperature increase time T1" shown in FIG. 12-(c), so that it is adjusted to a time the same as or close to the preset target RT.

As described above, in actual use, a lot of wafers W are sequentially heat-processed, while the target temperature SP is adjusted by the temperature controller 150 to realize a process adjusted in accordance with the target RT.

The before-adjustment RT (temperature increase time) may be shorter or longer than the target RT in the respective heat processing units, due to differences in the heater capacity of the hot plate, other component parts, installation ambience, external disturbance factors, such as a power supply voltage level, and so forth. However, where the before-adjustment RT is measured and an adjustment value "b" is calculated based on the time difference between the before-adjustment RT and target RT for each of the heat processing unit, as described above, the time RT can be the same as or close to the target RT. Consequently, it is possible to decrease the variations in device quality (thermal history) between wafers due to individual differences between heat processing units; which is a conventional problem caused in a heat process in a resist coating/developing system.

In the example described above, the target temperature is changed at the time point t3 when the detected temperature of the hot plate 121 returns to a temperature "a"° C.—lower than the target temperature. In another example, the target temperature may be changed at a time point when a predetermined time has elapsed from the time point t1 of starting the heat process. The calculation of the time point t1 of starting the heat process may be performed based on the detected temperature of the hot plate 121 or based on an external signal input from the central control section 19, in place of the method described above.

Then, an explanation will be given of a relation formula $b=f(\Delta t)$ for calculating an adjustment value "b" from the time difference $\Delta t$ between the before-adjustment RT and target RT.

This relation formula $b=f(\Delta t)$ is obtained in advance, as follows.

Specifically, a certain one of heat processing units for performing a heat process on a number of wafers is used such that RT is measured for each of cases using different adjustment values "b" to adjust the target temperature SP, as described above. Then, for example, a method of least squares or the like is used to obtain the relation between the adjustment value "b" and the time difference of RT relative to RT at the adjustment value "b"=0, as shown in FIG. 13.

Figure 13:
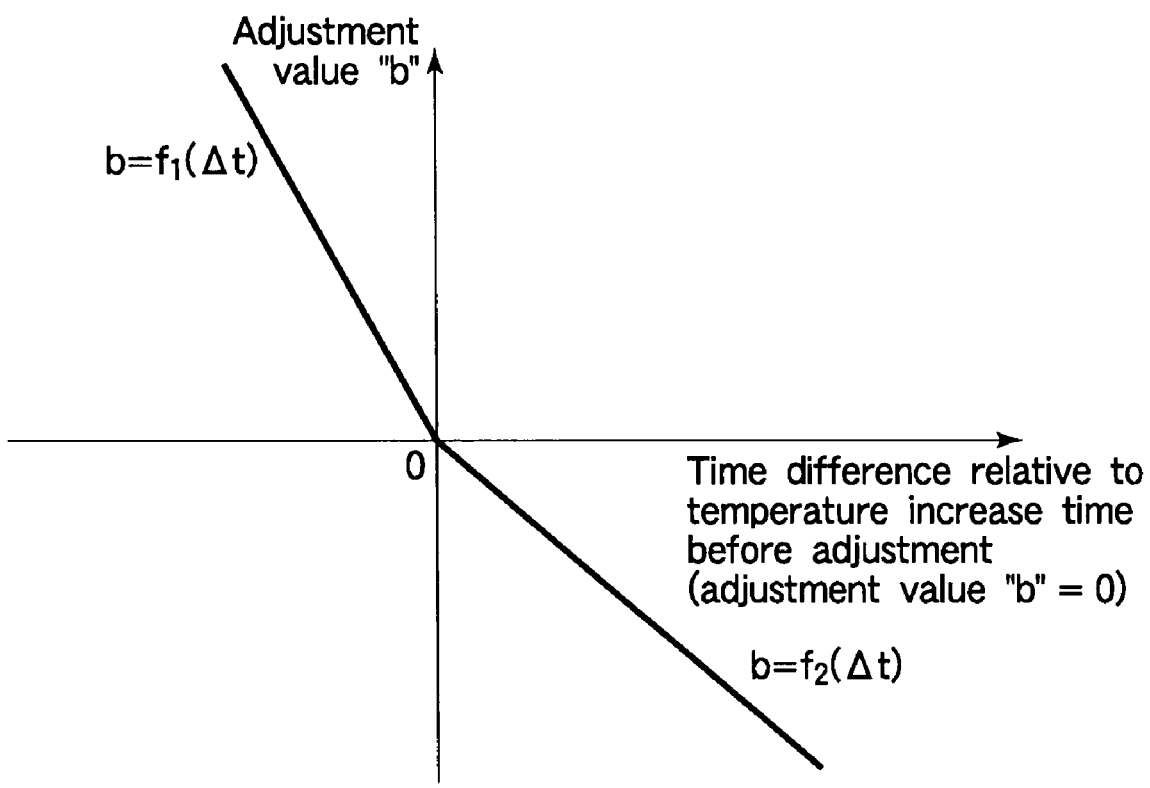
FIG. 13 is a view showing the relation between before-adjustment RT, time difference, and adjustment value "b"

The line shown in FIG. 13 makes it possible to find how a change in the adjustment value "b" shifts RT from a before-adjustment (b=0) value. The inclination of the line shown in FIG. 13 is essentially constant, regardless of heat process modules. Accordingly, where the relation between the adjustment value "b" and the time difference of RT relative to RT at the adjustment value "b"=0 in one heat processing unit is obtained, this relation can be applied to the other heat processing units. In place of use of only one heat processing unit to obtain the relation formula, a plurality of heat processing units may be used for measurement to obtain the relation described above based on the average value of the measurement results.

In this example, the line has different inclinations respectively in a range where the adjustment value "b" is positive and in a range where the adjustment value "b" is negative, so two relation formulas b=f1($\Delta$t) and b=f2($\Delta$t) are respectively used for the different inclinations.

Next, an explanation will be given of the inner constitution of the temperature controller 150.

Figure 14:
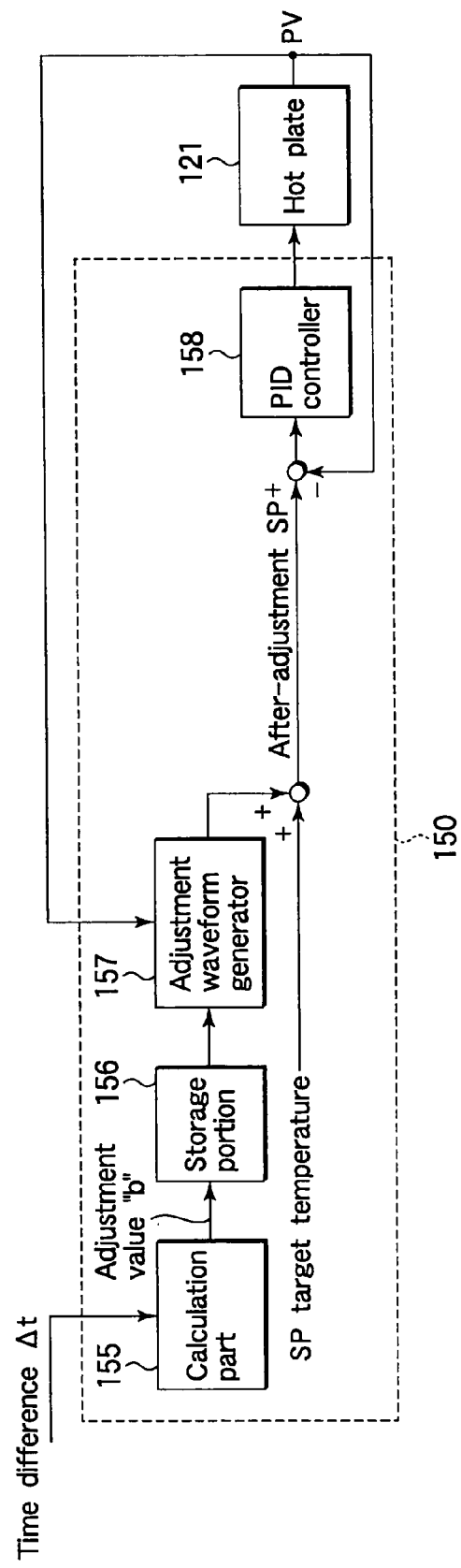
FIG. 14 is a block diagram showing a temperature controller.

FIG. 14 shows a block diagram of an inner constitution of the temperature controller 150. A calculation part 155 is disposed to calculate an adjustment value "b" based on the time difference $\Delta$t between a target RT and a before-adjustment RT given from the host controller or personal computer 154. A storage portion 156 is disposed to store the adjustment value "b". An adjusting portion or adjustment waveform generator 157 is disposed to generate an adjustment waveform for the target temperature in accordance with the adjustment value "b". A PID controller 158 is disposed to perform a PID calculation and output the operation amount, in accordance with the deviation between the after-adjustment target temperature SP and the detected temperature PV from the hot plate 121. The calculation part 155, storage portion 156, adjustment waveform generator 157, and PID controller 158 are constituted by a microcomputer.

Figure 15:
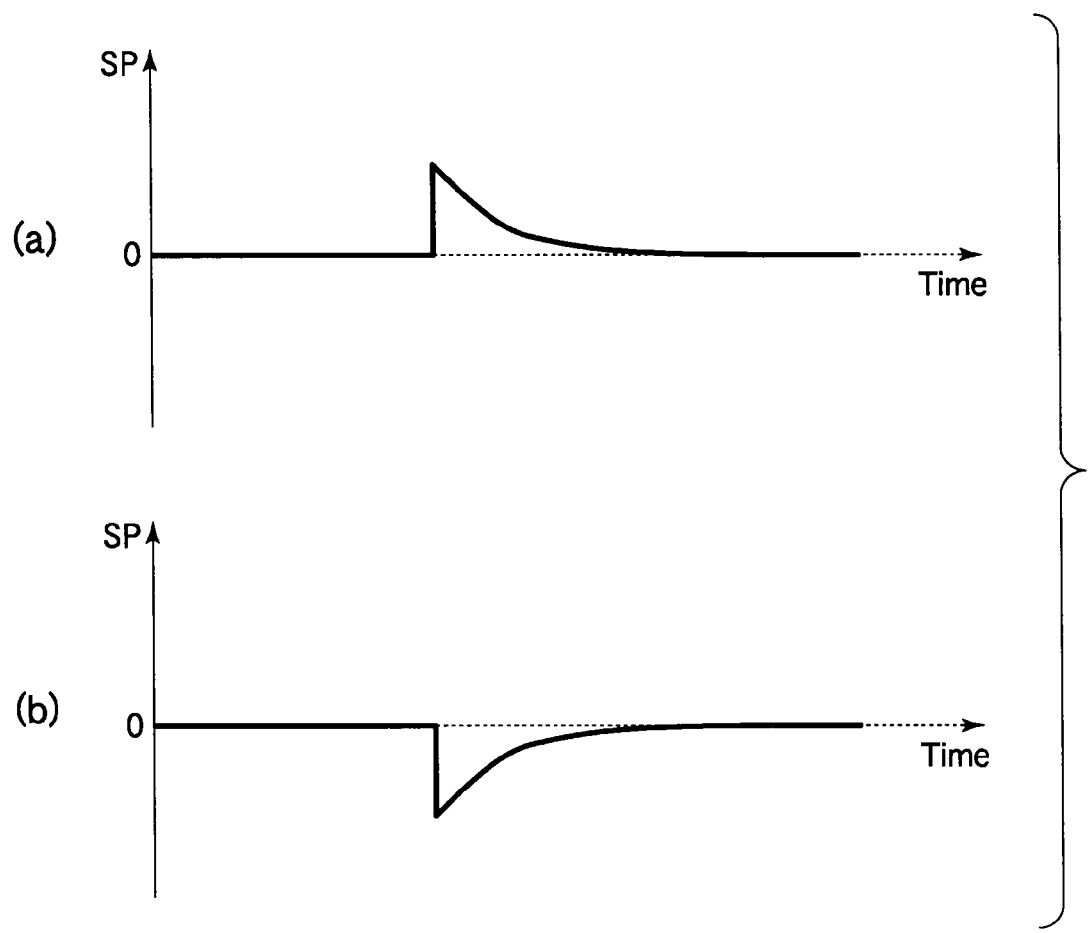
FIG. 15 is a view showing examples of an adjustment waveform of the target temperature.

Based on a detected PV from the hot plate 121, the adjustment waveform generator 157 forms an adjustment waveform show in FIG. 15-(*a*) or -(*b*) in accordance with the adjustment value "b", at a predetermined time point after the heat process, so that the target temperature SP is adjusted as shown in FIG. 12-(*b*) or -(*c*) described above.

Figure 16:
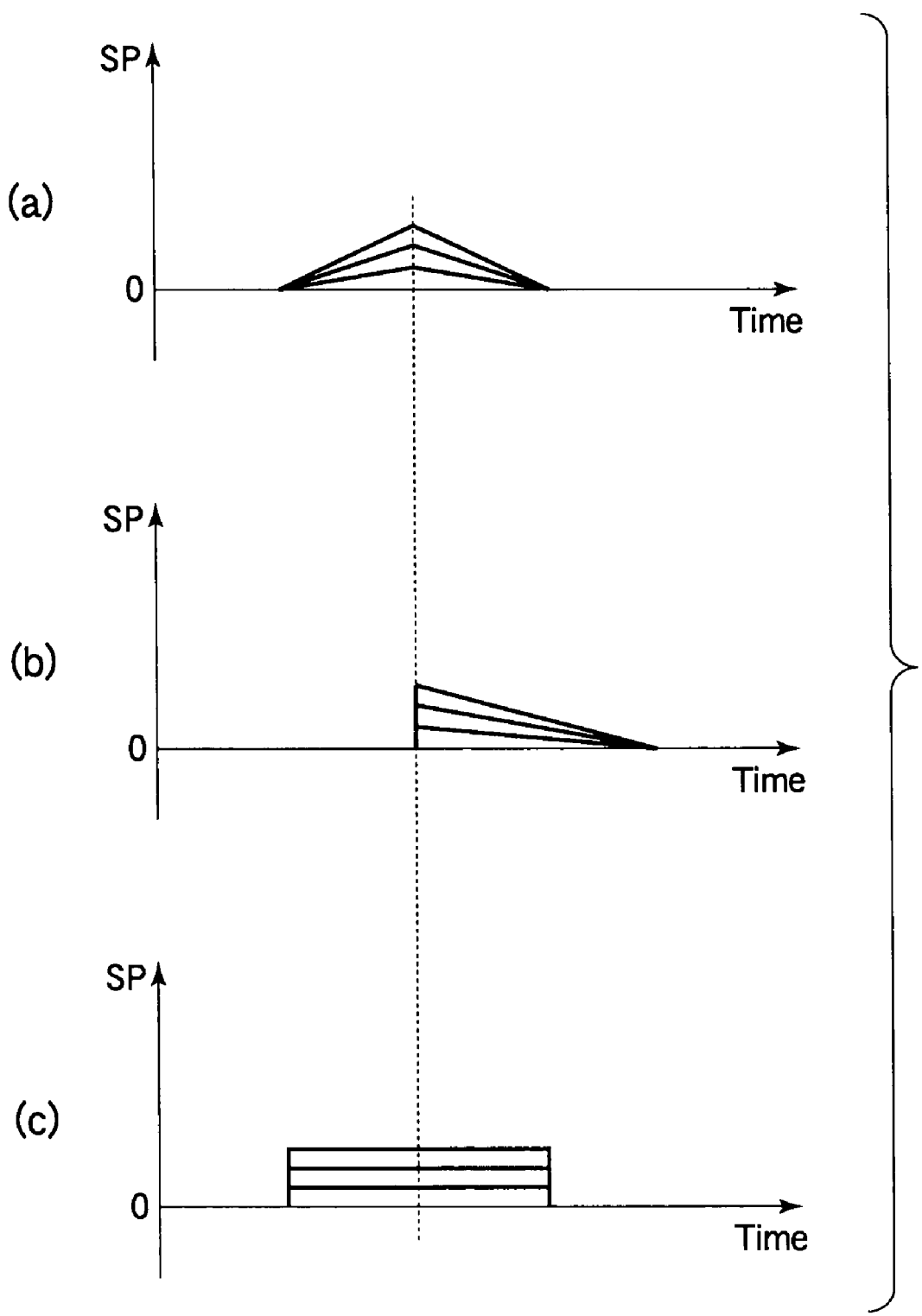
FIG. 16 is a view showing other examples of an adjustment waveform.

For example, the adjustment waveform may be formed of a triangular waveform shown in FIG. 16-(*a*) or -(*b*), a rectangular waveform shown in FIG. 16-(*c*), or another waveform, in accordance with the adjustment value "b".

The embodiment described above is arranged to adjust the reaching time defined by a time period for increasing the temperature of a target substrate from an initial temperature to a temperature around a target temperature. Consequently, it is possible to perform a preferable process on a target substrate while the reaching time is adjusted to be optimum to the process. Further, where a number of target substrates are processed by use of a plurality of heat processing units respectively including process devices, the reaching times of the heat processing units are adjusted to be a common target reaching time. Consequently, it is possible to decrease the process variations among the heat processing units.

The present invention is not limited to the embodiment described above, and it may be modified in various manners. For example, the present invention may be applied to a hot plate including a plurality of channels respectively formed of temperature sensors and heaters. In this case, as regards the before-adjustment RT to be adjusted by a test wafer and a logger, the average value of the detected temperatures of the respective channels of the test wafer may be used to measure the before-adjustment RT, or the average value of values of before-adjustment RT measured for the respective channels may be used as the before-adjustment RT.

In the embodiment described above, the temperature controller 150 is used to calculate an adjustment value. Alternatively, the host controller may be used to calculate an adjustment value and store it in the temperature controller 150, so that this adjustment value can be used to adjust the target temperature.

In the embodiment described above, the control is applied to a heat process using a heater to heat a hot plate. Alternatively, the control may be applied to a case using a thermo-electric element, such as a peltiert device, or a case using both of heating and cooling.

In the embodiment described above, the target substrate is exemplified by a semiconductor wafer, but the present invention may be applied to another substrate, such as a glass substrate for liquid crystal display devices (LCD).

The present invention is effectively applicable to the temperature control of a heat processing unit used in a resist coating/developing system for a substrate, such as a semiconductor wafer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A temperature control method for controlling a temperature of a hot plate, so that a measured temperature of the hot plate conforms to a target temperature thereof, in a heat processing apparatus for performing a heat process on a substrate placed on the hot plate, which is used in a coating/developing system for applying a resist coating onto the substrate to form a resist film and then performing development on the resist film after light exposure, the method comprising:

acquiring adjustment data necessary for adjusting a reaching time defined by a time period for increasing the temperature of the substrate from a first temperature around an initial temperature to a second temperature around the target temperature;

adjusting the target temperature by use of the adjustment data thus acquired, after starting the process on the substrate; and wherein said acquiring adjustment data includes a first stage arranged to measure a before-adjustment reaching time, and a second stage arranged to acquire the adjustment data by use of a time difference between a measured reaching time and a target reaching time.

2. The temperature control method according to claim 1, wherein the method comprises controlling the temperature of the hot plate by use of deviation between an after-adjustment target temperature and a measured temperature of the hot plate.

3. The temperature control method according to claim 1, wherein the method comprises selecting timing of temperature increase start used as a reference for the before-adjustment reaching time, from the group consisting of:

(a) a maximum point of a temperature increase rate obtained by approximating an average value of a substrate temperature profile by a polynomial equation of quintic or a higher degree, (b) a start point of increase in a substrate temperature caused upon loading of the substrate onto the hot plate, (c) a time point when a temperature increase rate exceeds a predetermined value in an average value of a substrate temperature profile, and (d) a point calculated by an inverse operation from a temperature decrease start point at an end of the heat process used as a reference.

4. The temperature control method according to claim 1, wherein the method comprises obtaining and determining the target reaching time in accordance with a temperature range of the process performed on the substrate, by use of an operation selected from the group consisting of:
- (a) setting the target reaching time in accordance with process conditions, and
- (b) presetting standard values for respective temperature ranges in accordance with a "hot plate vs. substrate" characteristic.

5. The temperature control method according to claim 1, wherein the second stage is arranged to acquire the adjustment data by use of a predetermined relation formula showing a relation between the time difference and the adjustment data.

6. The temperature control method according to claim 1, wherein the method comprises repeating the first stage and the second stage a plurality of times to acquire the adjustment data.

7. The temperature control method according to claim 1, wherein the method comprises adjusting the target temperature in accordance with the adjustment data at a predetermined timing after starting the process on the substrate.

8. The temperature control method according to claim 1, wherein the substrate is processed for a certain time on the hot plate.

9. The temperature control method according to claim 1, wherein the coating/developing system includes a plurality of heat processing units, and the method comprises adjusting reaching times of respective hot plates of the heat processing units to be a common target reaching time.

10. The temperature control method according to claim 9, wherein,
where the reaching time is longer than the common target reaching time, an operation is performed such that, when a detected temperature of the hot plate returns to a certain temperature lower than the target temperature after the substrate is placed on the hot plate and the heat process is started, the target temperature is increased by a first adjustment value, and is then decreased by the first adjustment value back to the target temperature by primary damping with a certain time constant, and
where the reaching time is shorter than the common target reaching time, an operation is performed such that, when a detected temperature of the hot plate returns to a certain temperature lower than the target temperature after the substrate is placed on the hot plate and the heat process is started, the target temperature is decreased by a second adjustment value, and is then increase by the second adjustment value back to the target temperature by primary damping with a certain time constant.

11. A temperature controller for controlling a temperature of a hot plate, so that
a measured temperature of the hot plate conforms to a target temperature thereof, in a heat processing apparatus for performing a heat process on a substrate placed on the hot plate, which is used in a coating/developing system for applying a resist coating onto the substrate to form a resist film and then performing development on the resist film after light exposure, the temperature controller comprising:
a storage portion that stores adjustment data necessary for adjusting a reaching time defined by a time period for increasing the temperature of the substrate from a first temperature around an initial temperature to a second temperature around the target temperature;
an adjusting portion that adjusts the target temperature by use of the adjustment data, after starting the process on the substrate; and
a calculation part arranged to calculate the adjustment data by use of a time difference between a before-adjustment reaching time and a target reaching time.

12. The temperature controller according to claim 11, wherein the adjusting portion is arranged to adjust the target temperature in accordance with the adjustment data at a predetermined timing after starting the process.

13. The temperature controller according to claim 11, wherein the coating/developing system includes a plurality of heat processing units with the reaching times of respective hot plates of the heat processing units being adjusted to be a common target reaching time and the adjusting portion is preset to conduct predetermined control in which,
where the reaching time is longer than the common target reaching time, an operation is performed such that, when a detected temperature of the hot plate returns to a certain temperature lower than the target temperature after the substrate is placed on the hot plate and the heat process is started, the target temperature is increased by a first adjustment value, and is then decreased by the first adjustment value back to the target temperature by primary damping with a certain time constant, and
where the reaching time is shorter than the common target reaching time, an operation is performed such that, when a detected temperature of the hot plate returns to a certain temperature lower than the target temperature after the substrate is placed on the hot plate and the heat process is started, the target temperature is decreased by a second adjustment value, and is then increase by the second adjustment value back to the target temperature by primary damping with a certain time constant.

14. The temperature controller according to claim 11, wherein the adjustment data is acquired by a first stage arranged to measure a before-adjustment reaching time and a second stage arranged to acquire the adjustment data by use of a time difference between a measured reaching time and a target reaching time, and
timing of temperature increase start used as a reference for the before-adjustment reaching time is set at a maximum point of a temperature increase rate obtained by approximating an average value of a substrate temperature profile by a polynomial equation of quintic or a higher degree.

15. A heat processing apparatus for performing a heat process on a substrate, which is used in a coating/developing system for applying a resist coating onto the substrate to form a resist film and then performing development on the resist film after light exposure, the heat processing apparatus comprising:
a hot plate configured to heat a substrate placed thereon;
a temperature detecting device configured to detect a temperature of the hot plate, and
a temperature controller for controlling a temperature of the hot plate, so that a detected temperature by the temperature detecting device conforms to a target temperature thereof,
wherein the temperature controller comprises
a storage portion that stores adjustment data necessary for adjusting a reaching time defined by a time period for increasing the temperature of the substrate from a first temperature around an initial temperature to a second temperature around the target temperature;
an adjusting portion that adjusts the target temperature by use of the adjustment data, after starting the process on the substrate; and a calculation part arranged to calculate the adjustment data by use of a time difference between a before-adjustment reaching time and a target reaching time.

16. The heat processing apparatus according to claim 15, wherein the adjusting portion is arranged to adjust the target temperature in accordance with the adjustment data at a predetermined timing after starting the process.

17. The heat processing apparatus according to claim 15, wherein the coating/developing system includes a plurality of heat processing units with the reaching ties of respective hot plates of the heat processing units being adjusted to be a common target reaching time and the adjusting portion is preset to conduct predetermined control in which, where the reaching time is longer than the common target reaching time, an operation is performed such that, when a detected temperature of the hot plate returns to a certain temperature lower than the target temperature after the substrate is placed on the hot plate and the heat process is started, the target temperature is increased by a first adjustment value, and is then decreased by the first adjustment value back to the target temperature by primary damping with a certain time constant, and where the reaching time is shorter than the common target reaching time, an operation is performed such that, when a detected temperature of the hot plate returns to a certain temperature lower than the target temperature after the substrate is placed on the hot plate and the heat process is started, the target temperature is decreased by a second adjustment value, and is then increase by the second adjustment value back to the target temperature by primary damping with a certain time constant.

18. The heat processing apparatus according to claim 15, wherein the adjustment data is acquired by a first stage arranged to measure a before-adjustment reaching time and a second stage arranged to acquire the adjustment data by use of a time difference between a measured reaching time and a target reaching time, and timing of temperature increase start used as a reference for the before-adjustment reaching time is set at a maximum point of a temperature increase rate obtained by approximating an average value of a substrate temperature profile by a polynomial equation of quintic or a higher degree.

\* \* \* \* \*